(12) United States Patent
Moy et al.

(10) Patent No.: US 10,763,323 B2
(45) Date of Patent: Sep. 1, 2020

(54) POWER AND DATA ROUTING STRUCTURES FOR ORGANIC LIGHT-EMITTING DIODE DISPLAYS

(71) Applicant: Apple Inc., Cupertino, CA (US)

(72) Inventors: Tiffany T. Moy, Princeton, NJ (US); Yuchi Che, Cupertino, CA (US); Seonpil Jang, Cupertino, CA (US); Warren S. Rieutort-Louis, Cupertino, CA (US); Bhadrinarayana Lalgudi Visweswaran, Santa Clara, CA (US); Jae Won Choi, San Jose, CA (US); Abbas Jamshidi Roudbari, San Jose, CA (US); Myung-Kwan Ryu, Yongin-Si (KR); Hirokazu Yamagata, Adachi-ku (JP); Keisuke Otsu, Yokohama (JP)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/375,756

(22) Filed: Apr. 4, 2019

(65) Prior Publication Data

US 2019/0393295 A1 Dec. 26, 2019

Related U.S. Application Data

(60) Provisional application No. 62/688,971, filed on Jun. 22, 2018.

(51) Int. Cl.
| | |
|---|---|
| *H01L 27/32* | (2006.01) |
| *H01L 51/00* | (2006.01) |
| *H01L 51/52* | (2006.01) |

(52) U.S. Cl.
CPC ...... *H01L 27/3279* (2013.01); *H01L 27/3272* (2013.01); *H01L 51/0097* (2013.01); *H01L 51/5284* (2013.01)

(58) Field of Classification Search
CPC .................................................. H01L 27/3297
See application file for complete search history.

(56) References Cited

U.S. PATENT DOCUMENTS

| 10,312,309 B2 | 6/2019 | Lin et al. |
|---|---|---|
| 2004/0135175 A1 | 7/2004 | Kurokawa |

(Continued)

FOREIGN PATENT DOCUMENTS

| CN | 203218266 U | 9/2013 |
|---|---|---|
| CN | 205081121 U | 3/2016 |

(Continued)

*Primary Examiner* — Erik Kielin
(74) *Attorney, Agent, or Firm* — Treyz Law Group, P.C.; Joseph F. Guihan

(57) ABSTRACT

An organic light-emitting diode display may have rounded corners. A negative power supply path may be used to distribute a negative voltage to a cathode layer, while a positive power supply path may be used to distribute a positive power supply voltage to each pixel in the display. The positive power supply path may have a cutout that is occupied by the negative power supply path to decrease resistance of the negative power supply path in a rounded corner of the display. To mitigate reflections caused by the positive power supply path being formed over tightly spaced data lines, the positive power supply path may be omitted in a rounded corner of the display, a shielding layer may be formed over the positive power supply path in the rounded corner, or non-linear gate lines may be formed over the positive power supply path.

21 Claims, 18 Drawing Sheets

(56) References Cited

U.S. PATENT DOCUMENTS

| | | | | |
|---|---|---|---|---|
| 2005/0078105 A1* | 4/2005 | Suh | ............... | H01L 27/3276 |
| | | | | 345/204 |
| 2005/0195355 A1* | 9/2005 | Kwak | ............ | H01L 51/5246 |
| | | | | 349/149 |
| 2005/0258771 A1* | 11/2005 | Kang | ............... | G09G 3/3225 |
| | | | | 315/169.1 |
| 2008/0252203 A1* | 10/2008 | Lee | ............... | H01L 27/3276 |
| | | | | 313/504 |
| 2016/0260792 A1 | 9/2016 | Kim et al. | | |
| 2016/0372534 A1* | 12/2016 | Lee | ............... | H01L 27/3276 |
| 2017/0338295 A1* | 11/2017 | Lee | ............... | H01L 27/3248 |
| 2018/0337226 A1* | 11/2018 | Liu | ............... | H01L 51/5221 |
| 2019/0319212 A1* | 10/2019 | Park | ............... | H01L 27/3276 |

FOREIGN PATENT DOCUMENTS

| | | | |
|---|---|---|---|
| CN | 107068712 A | 8/2017 | |
| CN | 107634651 A | 1/2018 | |
| CN | 107871765 A | 4/2018 | |
| WO | 2017127563 A1 | 7/2017 | |

* cited by examiner

POWER AND DATA ROUTING STRUCTURES FOR ORGANIC LIGHT-EMITTING DIODE DISPLAYS

This application claims the benefit of U.S. provisional patent application No. 62/688,971 filed Jun. 22, 2018, which is hereby incorporated by reference herein in its entirety.

BACKGROUND

This relates generally to electronic devices and, more particularly, to electronic devices with organic light-emitting diode displays.

Electronic devices often include displays. For example, an electronic device may have an organic light-emitting diode display based on organic-light-emitting diode pixels. Each pixel may have a pixel circuit that includes a respective light-emitting diode. Thin-film transistor circuitry in the pixel circuit may be used to control the application of current to the light-emitting diode in that pixel. The thin-film transistor circuitry may include a drive transistor. The drive transistor and the light-emitting diode in a pixel circuit may be coupled in series between a positive power supply and a negative power supply.

Signals in organic-light-emitting diode displays such as power supply signals may be subject to undesired voltage drops due to resistive losses in the conductive paths that are used to distribute these signals. If care is not taken, these voltage drops can interfere with satisfactory operation of an organic light-emitting diode display. Challenges may also arise in distributing power and data signals in displays having layouts in which signal routing space is limited.

It would therefore be desirable to be able to provide improve ways to distribute signals such as power supply and data signals on a display such as an organic light-emitting diode display.

SUMMARY

An organic light-emitting diode display may have thin-film transistor circuitry formed on a substrate. The display and substrate may have rounded corners. A pixel definition layer may be formed on the thin-film transistor circuitry. Openings in the pixel definition layer may be provided with emissive material overlapping respective anodes for organic light-emitting diodes.

A cathode layer may cover the array of pixels. A negative power supply path may be used to distribute a negative power supply voltage to the cathode layer, while a positive power supply path may be used to distribute a positive power supply voltage to each pixel in the array of pixels. The positive power supply path may have a cutout between two portions that is occupied by the negative power supply path to decrease resistance of the negative power supply path in a rounded corner of the display.

The negative power supply path may be formed from a metal layer that is shorted to the cathode layer using portions of a metal layer that forms the anodes for the diodes. Expanding the negative power supply path into the cutout region of the positive power supply path may increase the contact area between the negative power supply path and the anode metal layer and may increase the contact area between the anode metal layer and the cathode layer.

To mitigate reflections caused by the positive power supply path being formed over tightly spaced data lines, the positive power supply path may be omitted in a rounded corner region of the display. A shielding layer may be formed over the positive power supply path in the rounded corner region to mitigate the reflections. Non-linear gate lines may be formed over the positive power supply path in the rounded corner region to mitigate the reflections. An anti-reflection layer or light-absorbing organic layer may also be incorporated into the display to mitigate reflections.

DETAILED DESCRIPTION

Figure 1:
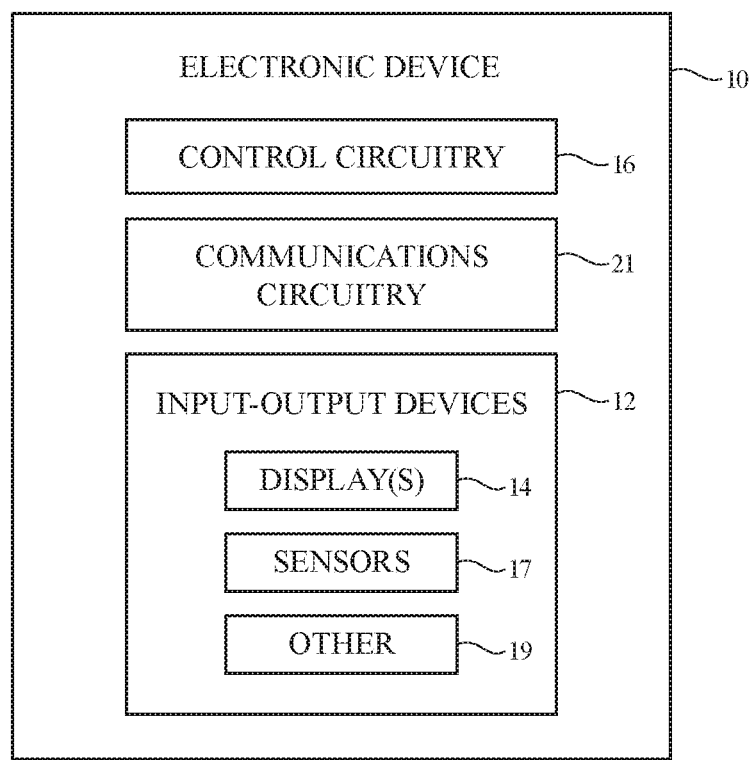
FIG. 1 is a diagram of an illustrative electronic device having a display in accordance with an embodiment.

An illustrative electronic device of the type that may be provided with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

Device 10 may include control circuitry 16. Control circuitry 16 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 16 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 16 may communicate using communications circuitry 21. Circuitry 21 may include antennas, radio-frequency transceiver circuitry, and other wireless communications circuitry and/or wired communications circuitry. Circuitry 21, which may sometimes be referred to as control circuitry and/or control and communications circuitry, may support bidirectional wireless communications between device 10 and external equipment over a wireless link (e.g., circuitry 21 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 12. Input-output devices 12 may be used in gathering user input, in gathering information on the environment surrounding the user, and/or in providing a user with output. Devices 12 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 17 in input-output devices 12 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 17 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 17 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 19 in input-output devices 12). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
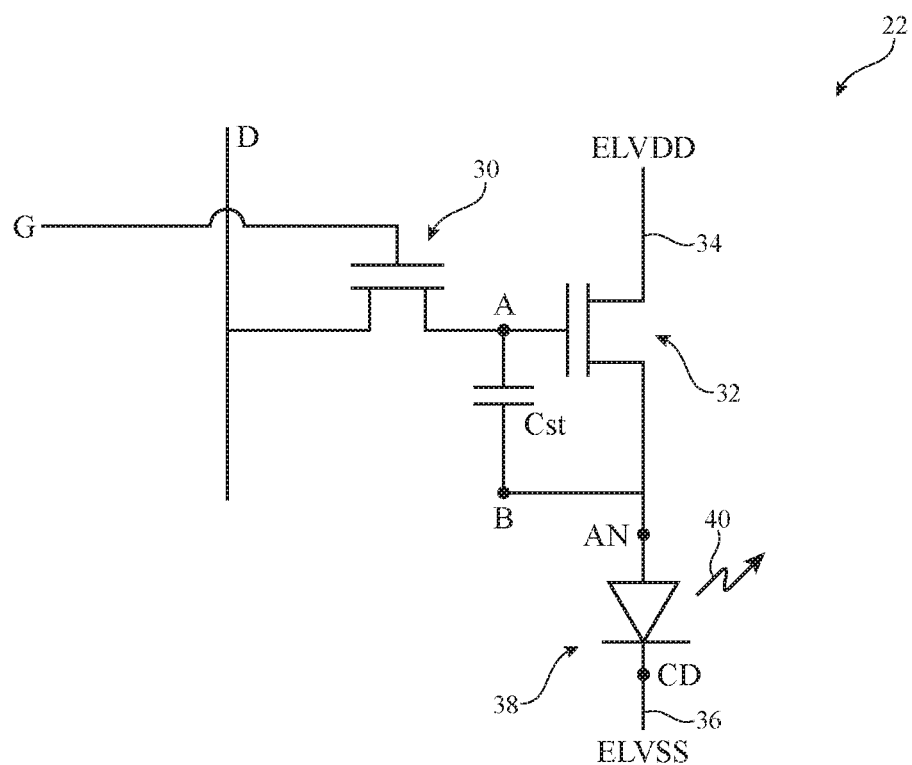
FIG. 2 is a diagram of an illustrative organic light-emitting diode pixel circuit in accordance with an embodiment.

Display 14 may be an organic light-emitting diode display. In an organic light-emitting diode display, each pixel contains a respective organic light-emitting diode. A schematic diagram of an illustrative organic light-emitting diode pixel is shown in FIG. 2. As shown in FIG. 2, display pixel 22 may include light-emitting diode 38. A positive power supply voltage ELVDD may be supplied to positive power supply terminal 34 and a negative power supply voltage ELVSS may be supplied to negative power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to negative power supply terminal 36, so cathode terminal CD of diode 38 may sometimes be referred to as the negative terminal for diode 38.

To ensure that transistor 32 is held in a desired state between successive frames of data, display pixel 22 may include a storage capacitor such as storage capacitor Cst. A first terminal of storage capacitor Cst may be coupled to the gate of transistor 32 at node A and a second terminal of storage capacitor Cst may be coupled to anode AN of diode 38 at node B. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on node A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38.

If desired, the circuitry for controlling the operation of light-emitting diodes for pixels 22 in display 14 (e.g., transistors, capacitors, etc. in display pixel circuits such as the display pixel circuit of FIG. 2) may be formed using configurations other than the configuration of FIG. 2 (e.g., configurations that include circuitry for compensating for threshold voltage variations in drive transistor 32, configurations in which an emission enable transistor is coupled in series with drive transistor 32, configurations with multiple switching transistors controlled by multiple respective scan lines, configurations with multiple capacitors, etc.). The circuitry of pixel 22 of FIG. 2 is merely illustrative.

Figure 3:
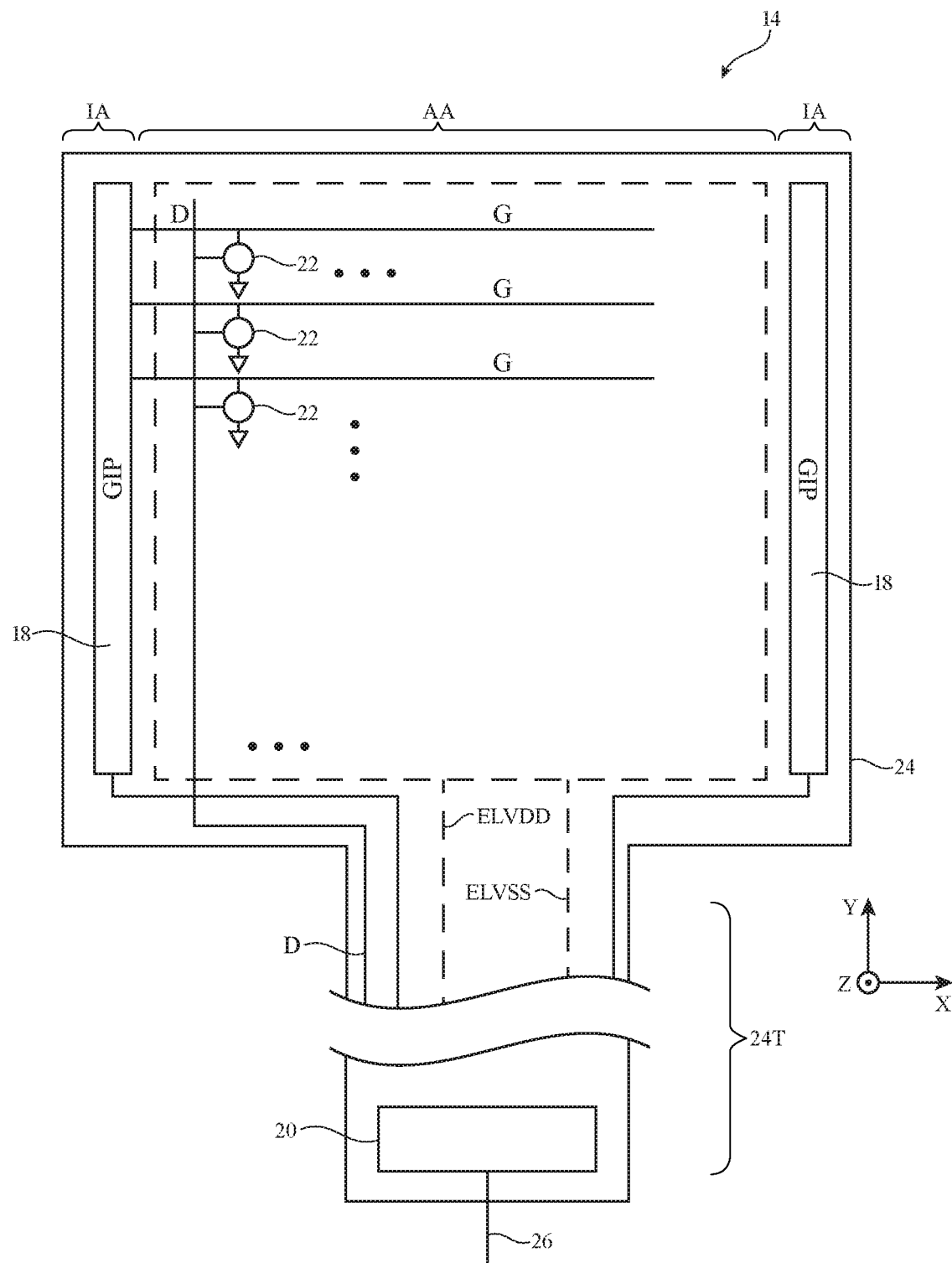
FIG. 3 is a diagram of an illustrative organic light-emitting diode display in accordance with an embodiment.

As shown in FIG. 3, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions. Substrate 24 may have a rectangular shape with left and right vertical edges and upper and lower horizontal edges or may have a non-rectangular shape. In configurations in which substrate 24 has a rectangular shape with four corners, the corners may, if desired, be rounded. Display substrate 24 may, if desired, have a tail portion such as tail 24T.

Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22).

Each pixel 22 may have a light-emitting diode such as organic light-emitting diode 38 of FIG. 2 and associated thin-film transistor circuitry (e.g., the pixel circuit of FIG. 2 or other suitable pixel circuitry). The array of pixels 22 may be formed from rows and columns of pixel structures (e.g., pixels formed from structures on display layers such as substrate 24). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 3, display substrate 24 may have a tail portion such as tail 24T that has a narrower width than the portion of substrate 24 that contains active area AA. This arrangement helps accommodate tail 24T within the housing of device 10. Tail 24T may, if desired, be bent under the rest of display 14 when display 14 is mounted within an electronic device housing.

Display driver circuitry 20 for display 14 may be mounted on a printed circuit board that is coupled to tail portion 24T or may be mounted on tail portion 24T. Signal paths such as signal path 26 may couple display driver circuitry 20 to control circuitry 16. Circuitry 20 may include one or more display driver integrated circuits and/or thin-film transistor circuitry. During operation, the control circuitry of device 10 (e.g., control circuitry 16 of FIG. 1) may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry (GIP) 18. Gate driver circuitry 18 may produce gate line signals (sometimes referred to as scan signals, emission enable signals, etc.) or other control signals for pixels 22. The gate line signals may be conveyed to pixels 22 using lines such as gate lines G. There may be one or more gate lines per row of pixels 22. Gate driver circuitry 18 may include integrated circuits and/or thin-film transistor circuitry and may be located along the edges of display 14 (e.g., along the left and/or right edges of display 14 as shown in FIG. 3) or elsewhere in display 14 (e.g., as part of circuitry 20 on tail 24T, along the lower edge of display 14, etc.). The configuration of FIG. 3 is merely illustrative.

Display driver circuitry 20 may supply data signals onto a plurality of corresponding data lines D. With the illustrative arrangement of FIG. 3, data lines D run vertically through display 14. Data lines D are associated with respective columns of pixels 22.

With the illustrative configuration of FIG. 3, gate lines G (sometimes referred to as scan lines, emission lines, etc.) run horizontally through display 14. Each gate line G is associated with a respective row of display pixels 22. If desired, there may be multiple horizontal control lines such as gate lines G associated with each row of pixels 22. Gate driver circuitry 18 may assert gate line signals on the gate lines G in display 14. For example, gate driver circuitry 18 may receive clock signals and other control signals from display driver circuitry 20 and may, in response to the received signals, assert a gate signal on gate lines G in sequence, starting with the gate line signal G in the first row of display pixels 22. As each gate line is asserted, data from data lines D is loaded into the corresponding row of display pixels. In this way, control circuitry in device 10 such as display driver circuitry 20 may provide pixels 22 with signals that direct pixels 22 to generate light for displaying a desired image on display 14.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin-film transistors, semiconducting-oxide transistors such as indium gallium zinc oxide transistors, etc.).

Conductive paths (e.g., one or more signal lines, blanket conductive films, and other patterned conductive structures) may be provided in display 14 to route data signals D and power signals such as positive power supply signal ELVDD and negative power supply signal ELVSS to pixels 22. As shown in FIG. 3, these signals may be provided to pixels 22 in active area AA using signal routing paths that receive signals D, ELVDD, and ELVSS from tail portion 24T of display 14.

Any desired signal path arrangements may be used to provide power supply signals ELVDD and ELVSS to pixels 22. Vertical and/or horizontal conductive paths may provide positive power supply signal ELVDD to each pixel (e.g., anode) in the display. For example, the display may include a plurality of vertical conductive paths, with each vertical conductive path providing the positive power supply signal to a respective column of pixels. Alternatively, the display may include a plurality of vertical and horizontal conductive paths (sometimes referred to as a mesh) that provides the positive power supply signal to the pixels in the display. The display may include L-shaped or other bent conductive paths for providing the positive power supply signals to the pixels.

The negative power supply signal ELVSS may be provided to a blanket cathode layer that is formed over the entire display. The cathode layer may cover all of pixels 22 in active area AA of display 14 and may have portions that extend into inactive area IA of display 14 that are coupled to negative power supply paths that supply the cathode layer with negative power supply voltage ELVSS. The cathode layer may be sufficiently thin to be transparent, resulting in a relatively large sheet resistance. To reduce the sheet resistance of the cathode and thereby allow negative power supply voltage ELVSS to be distributed to the cathode terminals of diodes 38 in pixels 22 with minimal IR losses, display 14 may be provided with supplemental conductive paths. For example, vertical and/or horizontal conductive paths (e.g., a mesh) formed in the active area of the display may be connected to negative power supply paths in the inactive area of the display to reduce the resistance. These examples of conductive paths for distributing power supply signals ELVDD and ELVSS are merely illustrative. Any desired arrangement of conductive paths may be used to distribute power supply signals ELVDD and ELVSS to the display.

Figure 4:
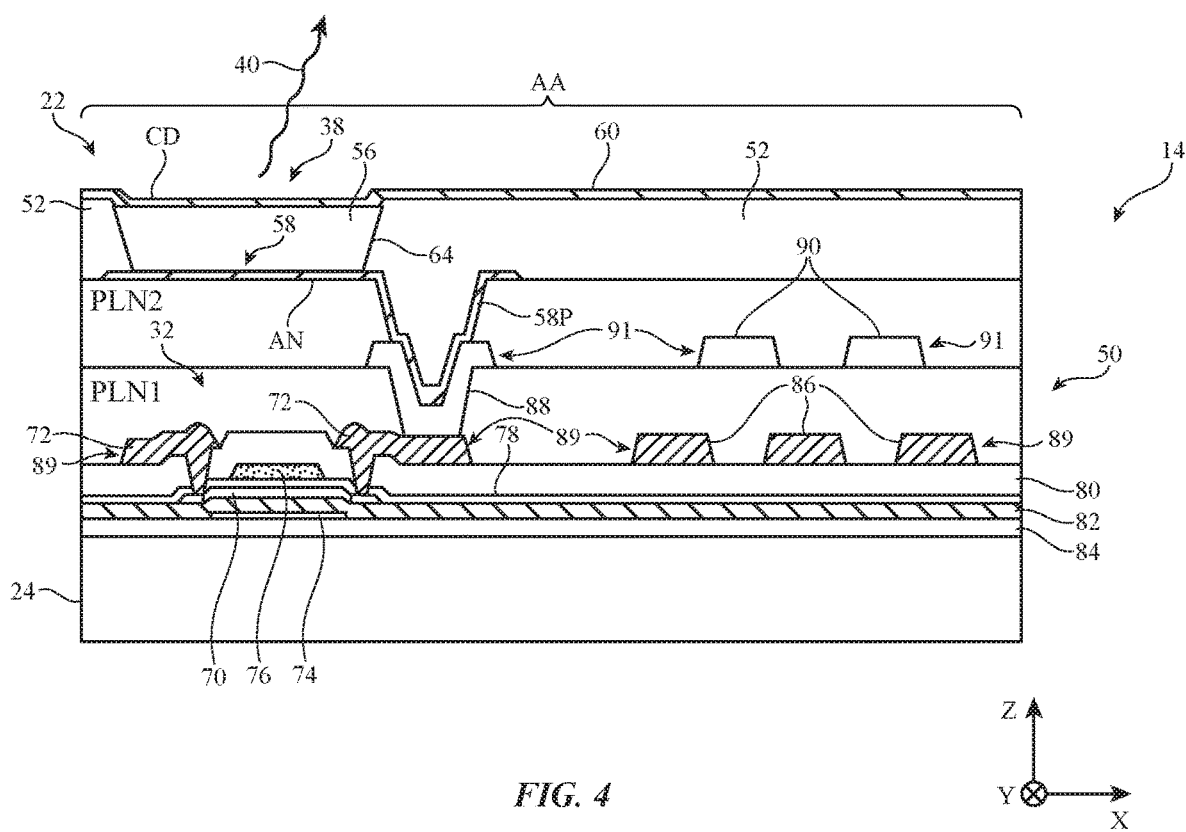
FIG. 4 is a cross-sectional side view of a portion of an active area of an illustrative organic light-emitting diode display in accordance with an embodiment.

A cross-sectional side view of a portion of active area AA of display 14 showing an illustrative configuration that may be used for forming pixels 22 is shown in FIG. 4. As shown in FIG. 4, display 14 may have a substrate such as substrate 24. Thin-film transistors, capacitors, and other thin-film transistor circuitry 50 (e.g., pixel circuitry such as the illustrative pixel circuitry of FIG. 2) may be formed on substrate 24. Pixel 22 may include organic light-emitting diode 38. Anode AN of diode 38 may be formed from metal layer 58 (sometimes referred to as an anode metal layer). Each diode 38 may have a cathode CD from conductive cathode structures such as cathode layer 60. Layer 60 may be, for example, a thin layer of metal such as a layer of magnesium silver with a thickness of 10-18 nm, more than 8 nm, less than 25 nm, etc. Layer 60 may cover all of pixels 22 in active area AA of display 14 and may have portions that extend into inactive area IA display 14 (e.g., so that layer 60 is coupled to negative power supply paths that supply layer 60 with negative power supply voltage ELVSS).

Each diode 38 has an organic light-emitting emissive layer (sometimes referred to as emissive material or an emissive layer structure) such as emissive layer 56. Emissive layer 56 is an electroluminescent organic layer that emits light 40 in response to applied current through diode 38. In a color display, emissive layers 56 in the array of pixels in the display include red emissive layers for emitting red light in red pixels, green emissive layers for emitting green light in green pixels, and blue emissive layers for emitting blue light in blue pixels. In addition to the emissive organic layer in each diode 38, each diode 38 may include additional layers for enhancing diode performance such as an electron injection layer, an electron transport layer, a hole transport layer, and a hole injection layer. Layers such as these may be formed from organic materials (e.g., materials on the upper and lower surfaces of electroluminescent material in layer 56).

Layer 52 (sometimes referred to as a pixel definition layer) has an array of openings containing respective portions of the emissive material of layer 56. An anode AN is formed at the bottom of each of these openings and is overlapped by emissive layer 56. The shape of the diode opening in pixel definition layer 52 therefore defines the shape of the light-emitting area for diode 38.

Pixel definition layer 52 may be formed from a photoimageable material that is photolithographically patterned (e.g., dielectric material that can be processed to form photolithographically defined openings such as photoimageable polyimide, photoimageable polyacrylate, etc.), may be formed from material that is deposited through a shadow mask, or may be formed from material that is otherwise patterned onto substrate 24. The walls of the diode openings in pixel definition layer 52 may, if desired, be sloped, as shown by sloped sidewalls 64 in FIG. 4. Sidewalls 64 may also have curved portions, multiple portions sloped at different angles, etc.

Thin-film circuitry 50 may contain a transistor such as illustrative transistor 32. Thin-film transistor circuitry such as illustrative thin-film transistor 32 of FIG. 4 may have active areas (channel regions) formed from a patterned layer of semiconductor such as layer 70. Layer 70 may be formed from a semiconductor layer such as a layer of polysilicon or a layer of a semiconducting-oxide material (e.g. indium gallium zinc oxide). Source-drain terminals 72 may contact opposing ends of semiconductor layer 70. Gate 76 may be formed from a patterned layer of gate metal or other conductive layer and may overlap semiconductor 70. Gate insulator 78 may be interposed between gate 76 and semiconductor layer 70. A buffer layer such as dielectric layer 84 may be formed on substrate 24 under shield 74. A dielectric layer such as dielectric layer 82 may cover shield 74. Dielectric layer 80 may be formed between gate 76 and source-drain terminals 72. Layers such as layers 84, 82, 78, and 80 may be formed from dielectrics such as silicon oxide, silicon nitride, other inorganic dielectric materials, or other dielectrics. Additional layers of dielectric such as organic planarization layers PLN1 and PLN2 may be included in thin-film transistor structures such as the structures of transistor 32 and may help planarize display 14.

Display 14 may have multiple layers of conductive material embedded in the dielectric layers of display 14 such as metal layers for routing signals through pixels 22. Shield layer 74 may be formed from a first metal layer (as an example). Gate layer 76 may be formed from a second metal layer. Source-drain terminals such as terminals 72 and other structures such as signal lines 86 may be formed from portions of a third metal layer such as metal layer 89. Metal layer 89 may be formed on dielectric layer 80 and may be covered with planarization dielectric layer PLN1. A fourth layer of metal such as metal layer 91 may be used in forming diode via portion 88 and signal lines 90. In active area AA, a fifth layer of metal such as anode metal layer 58 may form anodes AN of diodes 38. The fifth metal layer in each pixel may have a portion such as via portion 58P that is coupled to via portion 88, thereby coupling one of the source-drain terminals of transistor 32 to anode AN of diode 38. A sixth layer of metal (e.g., a blanket film) such as cathode metal layer 60 may be used in forming cathode CD for light-emitting diode 38. Anode layer 58 may be interposed between metal layer 91 and cathode layer 60. Layers such as layer 58, 91, 89, 76, and 74 may be embedded within the dielectric layers of display 14 that are supported on substrate 24. If desired, fewer metal layers may be provided in display 14 or display 14 may have more metal layers. The configuration of FIG. 4 is merely illustrative, and other arrangements for thin-film transistor circuitry 50 may be used if desired.

It is desirable to minimize ohmic losses (sometimes referred to as IR losses) when distributing power signals to pixels 22 to ensure that display 14 operates efficiently and produces images with even brightness across display 14. Ohmic losses may be minimized by incorporating low-resistance signal pathways into through display 14.

Some of the layers of display 14 such as cathode layer 60 may be thin. Cathode layer 60 may be formed from a metal such as magnesium silver. To ensure that cathode CD is sufficiently thin to be transparent, the thickness of layer 60 may be about 10-18 nm (or other suitable thickness). In this type of configuration, the sheet resistance of layer 60 may be relatively large (e.g., about 10 ohm/square). To reduce the sheet resistance of the cathode and thereby allow negative power supply voltage ELVSS to be distributed to the cathode terminals of diodes 38 in pixels 22 with minimal IR losses, display 14 may be provided with supplemental conductive paths. Such paths may also help display 14 of FIG. 4 (or displays with other types of thin-film stackups) accommodate display geometries with geometries that constrain signal distribution (e.g., displays with rounded corners, etc.).

With one illustrative configuration, portions of metal layer 89 and/or metal layer 91 may be used in forming signal paths such as signal paths 90 that serve as a supplemental ELVSS path (i.e., a signal path that can operate in parallel with the ELVSS path formed by cathode layer 60) and thereby help to minimize voltage drops and IR losses when operating display 14. Metal layer 91 and/or metal layer 89 may be shorted to cathode layer 60 along one or more of the edges of display 14 (e.g., along the left, right, and bottom edges, along two or more edges, three or more edges, etc.) and may provide a low resistance path between a source of signal ELVSS on tail 24T and respective edges of cathode layer 60 (i.e., there may be less resistance experienced when distributing a signal to the edge of layer 60 through signal lines in layer 91 than when distributing a signal to this portion of layer 60 through the thin metal of layer 60 itself). Reducing IR losses as power is supplied to layer 60 helps reduce power losses when driving diodes 38 in active area AA. The use of a portion of layer 91 and/or 89 to form part of the negative power supply path for distributing ELVSS in display 14 may also make it possible to reduce the width of inactive area IA. Portions of layer 91 and/or 89 may also be used to form supplemental conductive paths for distributing ELVDD in display 14.

Figure 5:
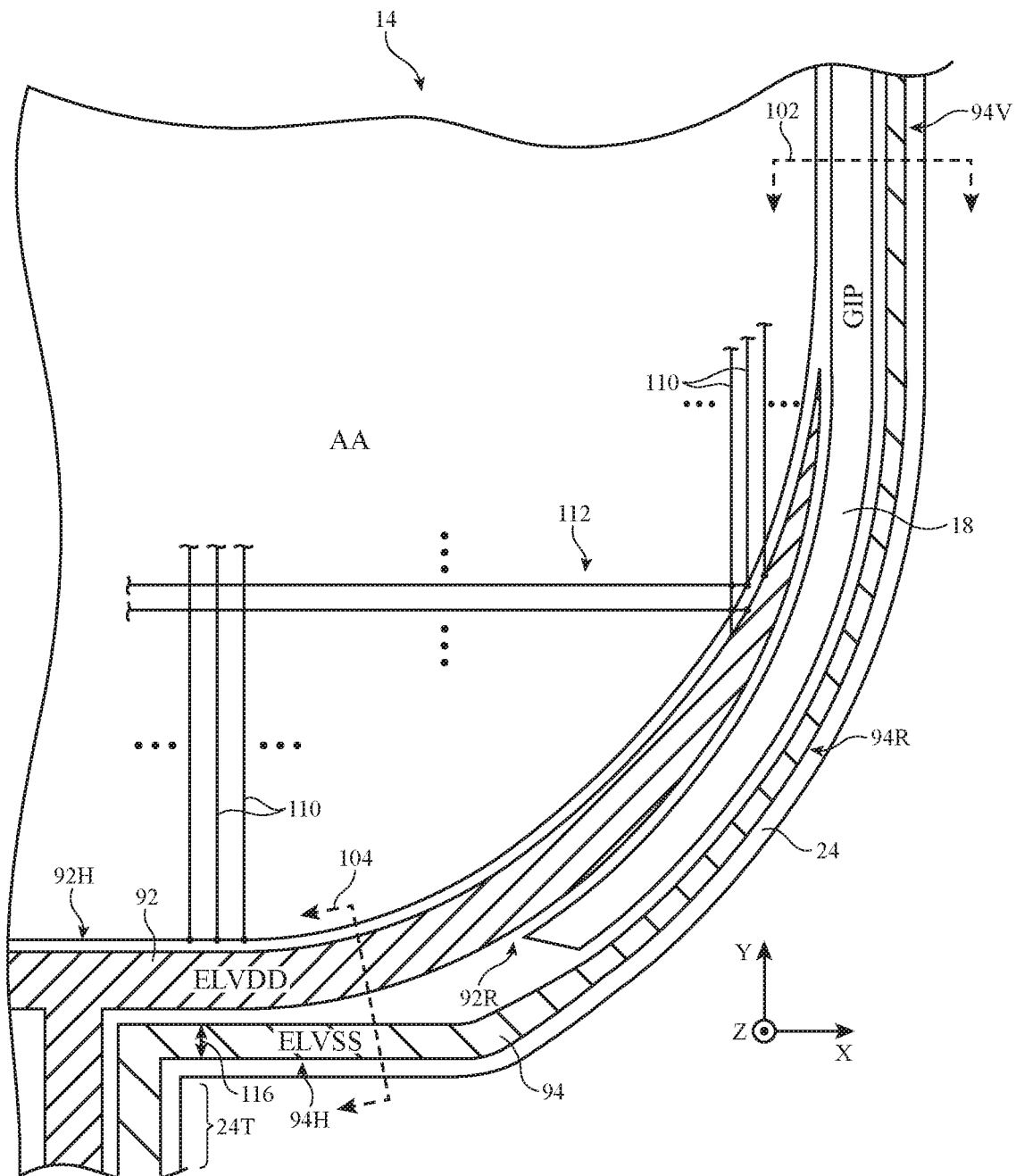
FIG. 5 is a top view of a rounded corner of an illustrative organic light-emitting diode display showing a negative power supply voltage distribution path and a positive power supply distribution path in accordance with an embodiment.

As previously mentioned, substrate 24 (and, accordingly, the active area of the display) may have a rectangular shape with four corners. One or more of the corners may be rounded corners (e.g., all of the corners may be rounded corners). The active area may optionally have a pixel-free notch region along the upper edge of the display. FIG. 5 is a top view of an illustrative display with a rounded corner. In particular, FIG. 5 shows an arrangement for conductive paths that distribute power supply voltages ELVDD and ELVSS.

As shown in FIG. 5, display 14 may include a first power distribution path 92 for distributing the positive power supply voltage ELVDD and a second power distribution path 94 for distributing the negative power supply voltage ELVSS. The first power distribution path 92 (sometimes referred to as a positive power supply voltage distribution path, ELVDD distribution path, a power supply line, a power rail, a conductive path, a power line, positive power supply path, etc.) may be provided with the positive power supply voltage ELVDD from tail portion 24T of display 14. The second power distribution path 94 (sometimes referred to as a negative power supply voltage distribution path, ELVSS distribution path, a power supply line, a power rail, a conductive path, a power line, negative power supply path, etc.) may be provided with the negative power supply voltage ELVSS from tail portion 24T of display 14.

Positive power supply voltage distribution path 92 has a horizontal portion 92H that runs along the lower edge of the active area of the display. Positive power supply voltage distribution path 92 also has a rounded corner portion 92R along the rounded corner of the active area of the display. The rounded corner portion 92R of power distribution path 92 is interposed between gate driver circuitry 18 (GIP) and active area AA of the display. The rounded corner portion 92R may extend far enough to provide the ELVDD signal to all of the peripheral columns of display pixels in the display (e.g., to the right-most column of pixels in the display). Positive power supply voltage distribution path 92 may be shorted to vertical ELVDD distribution paths that run through the active area of the display such as vertical ELVDD distribution paths 110. For clarity, only some of the vertical ELVDD distribution paths are shown in FIG. 5. Vertical ELVDD distribution paths 110 may optionally be connected with horizontal ELVDD distribution paths 112. The horizontal ELVDD distribution paths 112 form an ELVDD distribution mesh in combination with the vertical ELVDD distribution paths 110. For clarity, only some of the horizontal ELVDD distribution paths are shown in FIG. 5. Horizontal ELVDD distribution paths may be omitted if desired. The vertical and/or horizontal distribution paths may be coupled to the array of pixels 22 in the active area.

Negative power supply voltage distribution path 94 has a horizontal portion 94H that runs along the lower edge of the active area of the display. The horizontal portion 92H of positive power supply voltage distribution path 92 is interposed between the horizontal portion 94H and active area AA. Horizontal portion 94H of ELVSS distribution path 94 may have a width 116. Negative power supply voltage distribution path 94 also has a rounded corner portion 94R along the rounded corner of the active area of the display. Gate driver circuitry 18 is interposed between the rounded corner portion 94R of power distribution path 94 and the rounded corner portion 92R of power distribution path 92. Rounded corner portion 94R is interposed between horizontal portion 94H and a vertical portion 94V. Gate driver circuitry 18 is interposed between the vertical portion 94V of power distribution path 94 and active area AA.

The negative power supply voltage distribution path 94 may be shorted to the cathode layer that blankets the active area of the display. In particular, the ELVSS distribution path 94 may be electrically connected to the cathode layer through a layer of anode metal. Although the layer of anode metal does not actually form an anode, the layer of anode metal may be formed form the same layer of metal as the anodes in pixels 22 (and is thus referred to herein as anode metal or a layer of anode metal).

Figure 6:
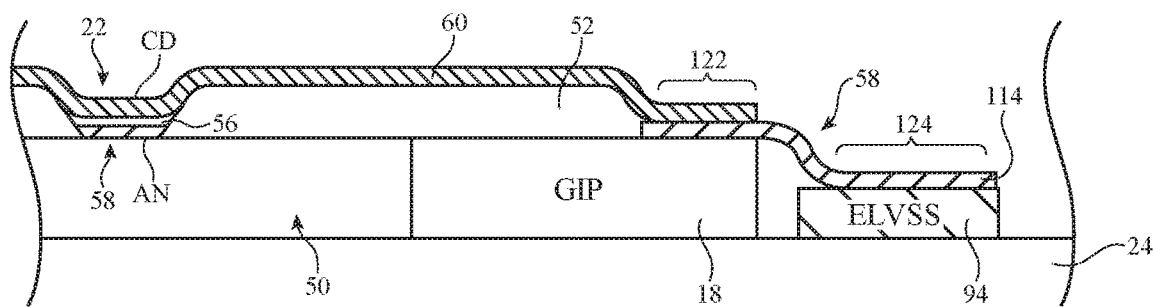
FIG. 6 is a cross-sectional side view of the display shown in FIG. 5 showing how the negative power supply voltage distribution path is shorted to the cathode layer along the right edge of the display in accordance with an embodiment.

FIG. 6 is a cross-sectional side view taken along line 102 in FIG. 5 showing how the ELVSS distribution path is shorted to the cathode layer along the edge of the display (e.g., the right edge of the display). FIG. 6 shows a pixel 22 (e.g., a pixel adjacent to the edge of the active area) having an anode AN formed from metal layer 58, emissive layers 56, and cathode 60 (CD). For simplicity, the details of thin-film transistor circuitry 50 (e.g., such as thin-film transistor circuitry 50 in FIG. 4) are not explicitly shown in FIG. 6.

As shown in FIG. 6, gate driver circuitry 18 is interposed between pixel 22 (and thin-film transistor circuitry 50) and ELVSS distribution path 94. To couple the ELVSS distribution path 94 to cathode layer 60, anode metal layer 58 includes an additional portion 114. Portion 114 of metal layer 58 is formed in the same deposition step as anode AN (and is therefore formed from the same material as anode AN). As previously discussed, portion 114 may be referred to as anode metal even though it does not form a pixel anode. Anode metal 114 may be formed over gate driver circuitry 18 and adjacent to pixel definition layer 52. A first portion of anode metal 114 is interposed between gate driver circuitry 18 and cathode layer 60. The first portion of the anode metal may directly contact cathode layer 60 on one side in contact area 122. A second portion of the anode metal 114 is formed over and in direct contact with ELVSS distribution path 94 in contact area 124. In this way, anode metal electrically connects cathode layer 60 to ELVSS distribution path 94. If desired, one or more intervening dielectric layers (e.g., organic dielectric layers or other desired dielectric layers) may be formed between anode metal 114 and gate driver circuitry 18.

Figure 7:
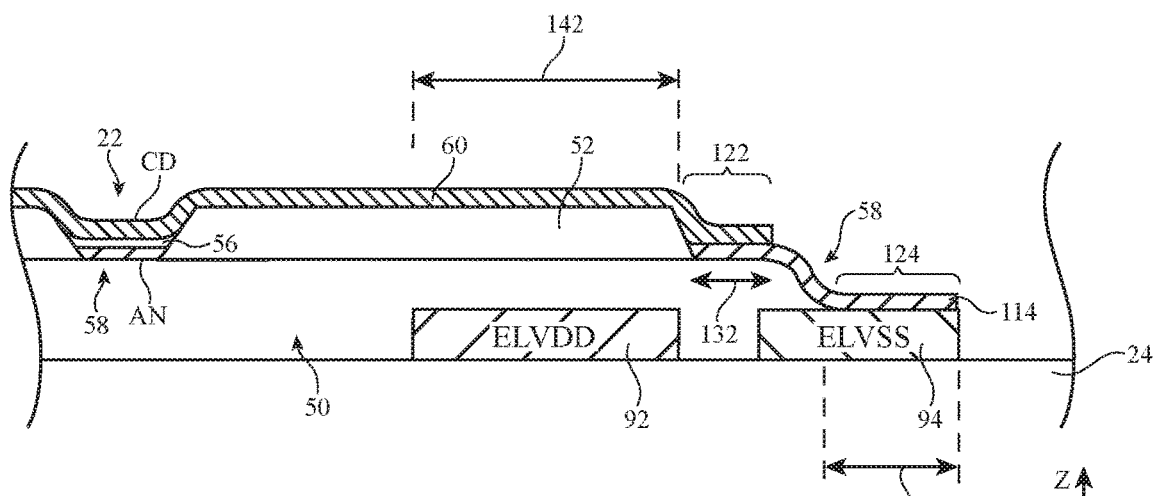
FIG. 7 is a cross-sectional side view of the display shown in FIG. 5 showing how the negative power supply voltage distribution path is shorted to the cathode layer along the rounded corner of the display in accordance with an embodiment.

FIG. 7 is a cross-sectional side view taken along line 104 in FIG. 5 showing how the ELVSS distribution path is shorted to the cathode layer along the edge of the display (e.g., the lower edge of the display along a rounded corner). FIG. 7 shows a pixel 22 (e.g., a pixel adjacent to the edge of the active area) having an anode AN formed from metal layer 58, emissive layers 56, and cathode 60 (CD). For simplicity, the details of thin-film transistor circuitry 50 (e.g., such as thin-film transistor circuitry 50 in FIG. 5) are not explicitly shown in FIG. 7.

As shown in FIG. 7, ELVDD distribution path 92 is interposed between pixel 22 (and thin-film transistor circuitry 50) and ELVSS distribution path 94. Similar to as discussed in connection with FIG. 6, anode metal 114 is used to couple the ELVSS distribution path 94 to cathode layer 60. Portion 114 of metal layer 58 may be referred to as anode metal even though it does not form a pixel anode. Anode metal 114 may be formed adjacent to pixel definition layer 52. Anode metal 114 may be formed over one or more dielectric layers. For example, anode metal 114 may be formed over planarization layers (e.g., organic planarization layers) such as PLN2 and/or PLN1 shown in FIG. 4. A first portion of anode metal 114 may directly contact cathode layer 60 on one side in contact area 122. A second portion of the anode metal 114 is formed over and in direct contact with ELVSS distribution path 94 in contact area 124. In this way, anode metal 114 electrically connects cathode layer 60 to ELVSS distribution path 94.

Figure 8:
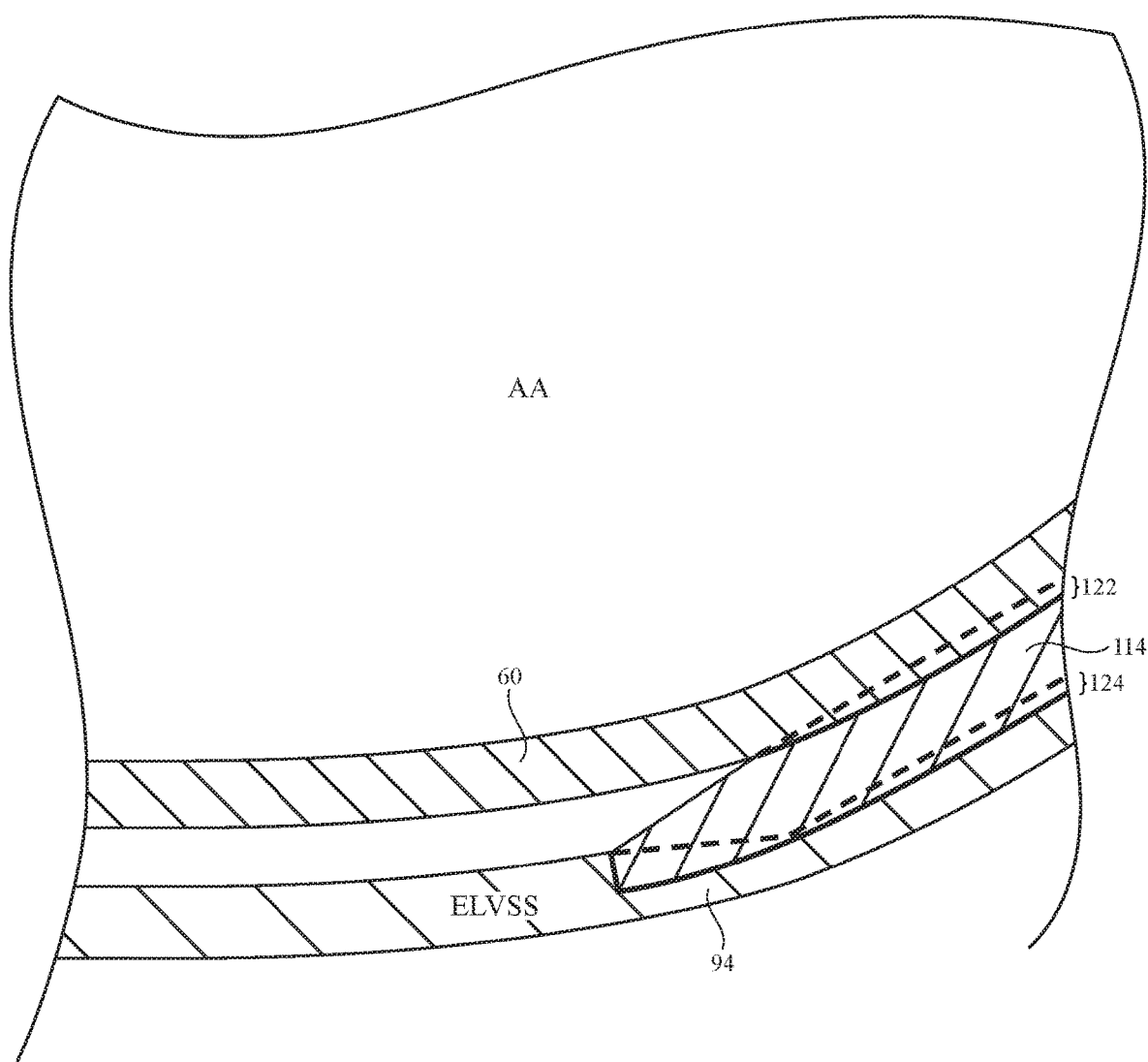
FIG. 8 is a top view of the rounded corner of the illustrative display of FIG. 5 showing the contact area between the cathode layer and the anode metal layer and the contact area between the anode metal layer and the negative power supply voltage distribution path in accordance with an embodiment.

FIG. 8 is a top view of the illustrative display of FIG. 5 showing the cathode to anode metal contact area and the anode metal to ELVSS distribution path contact area. As shown in FIG. 8, cathode layer 60 extends past the active area of the display into the inactive area. Although only the portion of cathode layer 60 in the inactive area is shaded, it should be understood that the cathode layer is formed as a blanket layer across the entire display. Cathode layer 60 overlaps anode metal 114. Cathode layer 60 and anode metal 114 have a contact area 122. Anode metal 114 overlaps ELVSS distribution path 94. Anode metal 114 and ELVSS distribution path 94 have a contact area 124.

Figure 10:
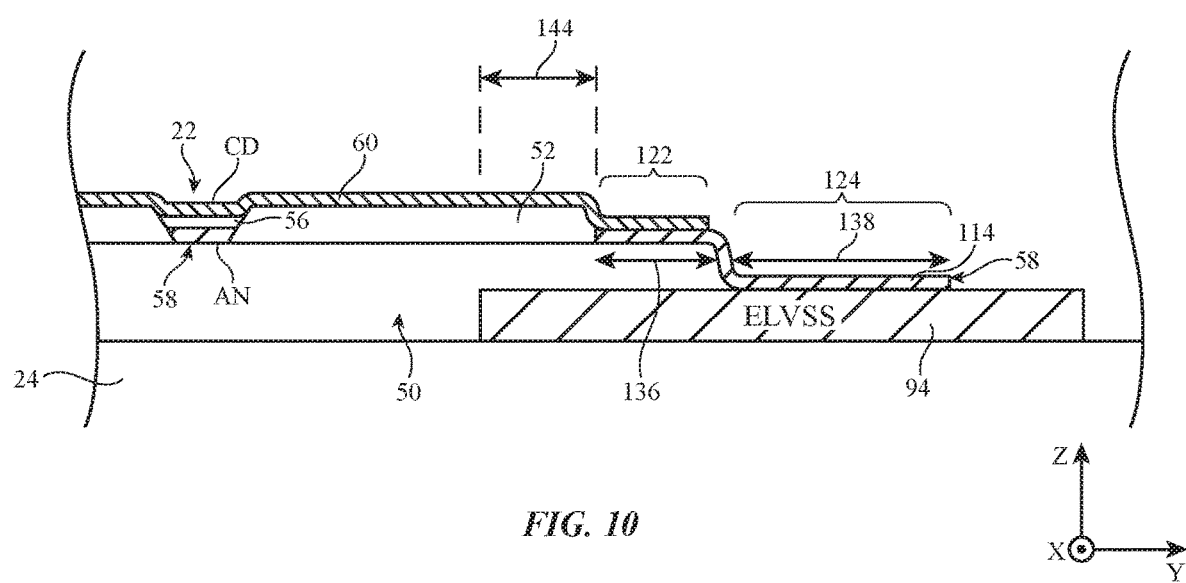
FIG. 10 is a cross-sectional side view of the display shown in FIG. 9 showing how the negative power supply voltage distribution path is shorted to the cathode layer along the rounded corner of the display in accordance with an embodiment.
Figure 11:
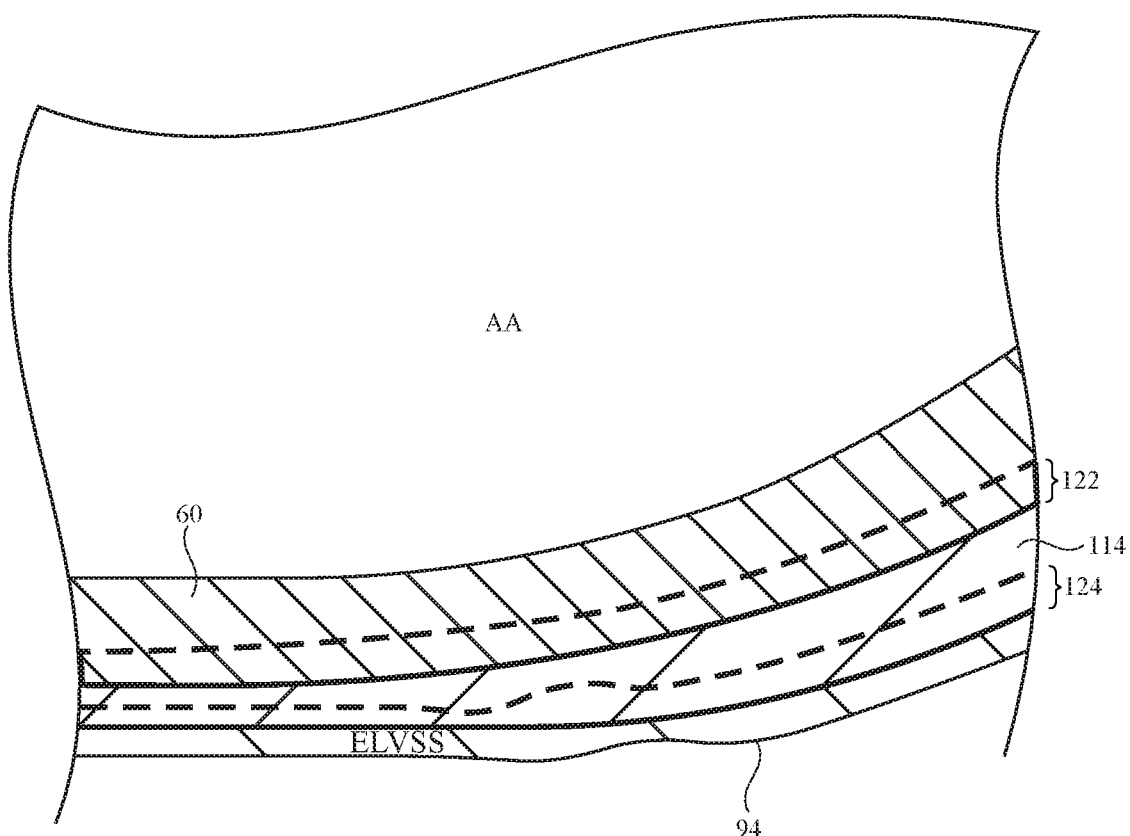
FIG. 11 is a top view of the rounded corner of the illustrative display of FIG. 9 showing the contact area between the cathode layer and the anode metal layer and the contact area between the anode metal layer and the negative power supply voltage distribution path in accordance with an embodiment.

The arrangement for ELVSS distribution path 94 in FIGS. 5-8 is merely illustrative. In certain embodiments (e.g., when inactive area space is limited), an arrangement as shown in FIGS. 5-8 may cause undesirable temperature increases in the rounded corner area of the display. Limited inactive area space restricts the area available for the ELVSS distribution path. With the ELVSS distribution path arrangement of FIGS. 5-8, high resistance and high current density may increase the temperature of the display past desired levels (especially when brightness levels for the display are high). To avoid this temperature increase, a portion of the ELVDD distribution path may be removed and the ELVSS distribution path may be expanded. This decreases ELVSS distribution path resistance, improving thermal performance of the display. Increasing the size of the ELVSS distribution path also increases the size of the cathode to anode metal contact area and ELVSS distribution path to anode metal contact area, providing additional improvements to thermal performance. An embodiment of this type is shown in FIGS. 9-11.

Figure 9:
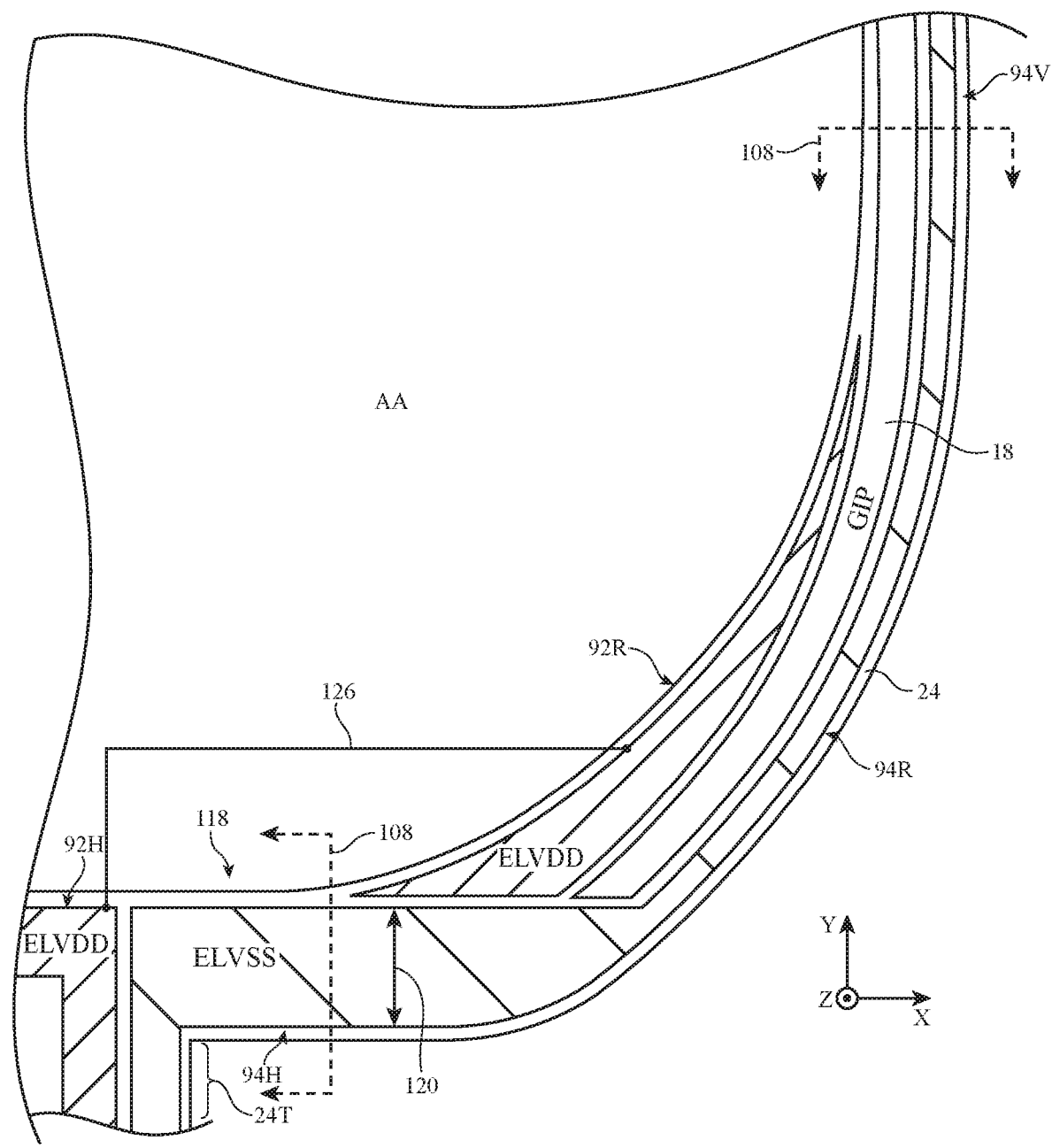
FIG. 9 is a top view of a rounded corner of an illustrative organic light-emitting diode display showing a negative power supply voltage distribution path that has an expanded width to occupy a cutout region of a positive power supply distribution path in accordance with an embodiment.

As shown in FIG. 9, display 14 may include a first power distribution path 92 for distributing the positive power supply voltage ELVDD and a second power distribution path 94 for distributing the negative power supply voltage ELVSS. The first power distribution path 92 (sometimes referred to as a positive power supply voltage distribution path, ELVDD distribution path, a power supply line, a power rail, a conductive path, a power line, positive power supply path, etc.) may be provided with the positive power supply voltage ELVDD from tail portion 24T of display 14. The second power distribution path 94 (sometimes referred to as a negative power supply voltage distribution path, ELVSS distribution path, a power supply line, a power rail, a conductive path, a power line, negative power supply path, etc.) may be provided with the negative power supply voltage ELVSS from tail portion 24T of display 14.

Positive power supply voltage distribution path 92 has a horizontal portion 92H that runs along the lower edge of the active area of the display. Positive power supply voltage distribution path 92 also has a rounded corner portion 92R along the rounded corner of the active area of the display. The rounded corner portion 92R of power distribution path 92 is interposed between gate driver circuitry 18 (GIP) and active area AA of the display. However, unlike in FIG. 5 (in which a continuous conductive path forms both horizontal portion 92H and rounded corner portion 92R of ELVDD distribution path 92), in FIG. 9 horizontal portion 92H and rounded corner portion 92R are formed separately. In other words, there may be a cutout (discontinuity) 118 in ELVDD distribution path 92 between the horizontal portion 92H and the rounded corner portion 92R.

Negative power supply voltage distribution path 94 has a horizontal portion 94H that runs along the lower edge of the active area of the display. In FIG. 9, horizontal portion 94H of ELVSS distribution path 94 is expanded to occupy the cutout area of ELVDD distribution path 92. By expanding the size of horizontal distribution path 94H, the width 120 of horizontal distribution path 94H may be increased (relative to the width 116 of horizontal distribution path 94H in FIG. 5). The horizontal portion 94H of negative power supply voltage distribution path 94 has a portion directly adjacent to the active area (without an intervening ELVDD distribution path and without intervening gate driver circuitry). The horizontal portion 94H also has a portion adjacent to the rounded corner portion 92R of ELVSS distribution path 92 and adjacent to gate driver circuitry 18. Negative power supply voltage distribution path 94 also has a rounded corner portion 94R along the rounded corner of the active area of the display. Gate driver circuitry 18 is interposed between the rounded corner portion 94R of power distribution path 94 and the rounded corner portion 92R of power distribution path 92. Rounded corner portion 94R is interposed between horizontal portion 94H and a vertical portion 94V. Gate driver circuitry 18 is interposed between the vertical portion 94V of power distribution path 94 and active area AA.

The negative power supply voltage distribution path 94 may be shorted to the cathode layer that blankets the active area of the display. In particular, the ELVSS distribution path 94 may be electrically connected to the cathode layer through a layer of anode metal.

As discussed in FIG. 5, vertical and horizontal distribution paths such as vertical distribution paths 110 and horizontal distribution paths 112 may be used to electrically connect ELVDD distribution path 92 to each pixel in the display. In FIG. 9, vertical distribution paths 110 and horizontal distribution paths 112 similar to those shown in FIG. 5 may be used to electrically connect horizontal portion 92H of the distribution path to rounded corner portion 92R of the distribution path. For example, vertical distribution paths may be coupled to horizontal portion 92H. Horizontal distribution paths may be coupled to both the vertical distribution paths and rounded corner portion 92R. Rounded corner portion 92R may then be coupled to additional vertical distribution paths. Instead or in addition, L-shaped distribution paths such as L-shaped distribution path 126 may be used to electrically connect horizontal portion 92H of the distribution path to rounded corner portion 92R of the distribution path.

The cross-sectional side view taken along line 106 in FIG. 9 is the same as the cross-sectional side view taken along line 102 in FIG. 5 (shown in FIG. 6). As shown in connection with FIG. 6, the ELVSS distribution path is shorted to the cathode layer along the edge of the display using anode metal.

FIG. 10 is a cross-sectional side view taken along line 108 in FIG. 9 showing how the ELVSS distribution path is shorted to the cathode layer along the edge of the display (e.g., the lower edge of the display along a rounded corner). FIG. 10 shows a pixel 22 (e.g., a pixel adjacent to the edge of the active area) having an anode AN formed from metal layer 58, emissive layers 56, and cathode 60 (CD). For simplicity, the details of thin-film transistor circuitry 50 (e.g., such as thin-film transistor circuitry 50 in FIG. 5) are not explicitly shown in FIG. 10.

Unlike in FIG. 7 where ELVDD distribution path 92 is interposed between pixel 22 (and thin-film transistor circuitry 50) and ELVSS distribution path 94, in FIG. 10 the ELVSS distribution path 94 is directly adjacent to the active area of the display. Anode metal 114 is used to couple the ELVSS distribution path 94 to cathode layer 60. Portion 114 of metal layer 58 may be referred to as anode metal even though it does not form a pixel anode. Anode metal 114 may be formed adjacent to pixel definition layer 52. Anode metal 114 may be formed over one or more dielectric layers. For example, anode metal 114 may be formed over planarization layers (e.g., organic planarization layers) such as PLN2 and/or PLN1 shown in FIG. 4. A first portion of anode metal 114 may directly contact cathode layer 60 on one side in contact area 122. A second portion of the anode metal 114 is formed over and in direct contact with ELVSS distribution path 94 in contact area 124. In this way, anode metal electrically connects cathode layer 60 to ELVSS distribution path 94.

Removing a portion of the ELVDD distribution path 92 and expanding the ELVSS distribution path may increase the size of the anode metal contact areas. For example, in FIG. 7 the width of the cathode layer to anode metal contact area 122 is width 132 whereas the width of the anode metal to ELVSS distribution path contact area 124 is width 134. In FIG. 10, the width of the cathode layer to anode metal contact area 122 is width 136 that is larger than width 132 in FIG. 7. Similarly, in FIG. 10 the width of the anode metal to ELVSS distribution path contact area 124 is width 138 that is larger than width 134 in FIG. 7. Additionally, in FIG. 7 the pixel definition layer 52 extends into the inactive area of the display by a distance 142. Distance 142 also defines the distance of the anode metal 114 from the active area of the display. In FIG. 10 the pixel definition layer 52 extends into the inactive area of the display by a distance 144 that is less than distance 142 in FIG. 7. Distance 144 also defines the distance of the anode metal 114 from the active area of the display. Therefore, the distance of the anode metal 114 from the active area of the display is less in FIG. 10 than in FIG. 7. Distance 144 may be any desired distance (e.g., less than 500 microns, less than 200 microns, less than 100 microns, less than 50 microns, less than 30 microns, greater than 10 microns, greater than 30 microns, between 25 and 75 microns, between 10 and 150 microns, etc.).

FIG. 11 is a top view of the illustrative display of FIG. 9 showing the cathode to anode metal contact area and the anode metal to ELVSS distribution path contact area. As shown in FIG. 11, cathode layer 60 extends past the active area of the display into the inactive area. Although only the portion of cathode layer 60 in the inactive area is shaded, it should be understood that the cathode layer is formed as a blanket layer across the entire display. Cathode layer 60 overlaps anode metal 114. Cathode layer 60 and anode metal 114 have a contact area 122. It can be seen that the arrangement of FIGS. 9-11 results in a larger contact area 122 than in the arrangement of FIGS. 5-8. Anode metal 114 also overlaps ELVSS distribution path 94. Anode metal 114 and ELVSS distribution path 94 have a contact area 124. It can be seen that the arrangement of FIGS. 9-11 results in a larger contact area 124 than in the arrangement of FIGS. 5-8. The increased size of the contact areas may result in improved thermal performance of the display of FIGS. 9-11 compared to the display of FIGS. 5-8.

Figure 12:
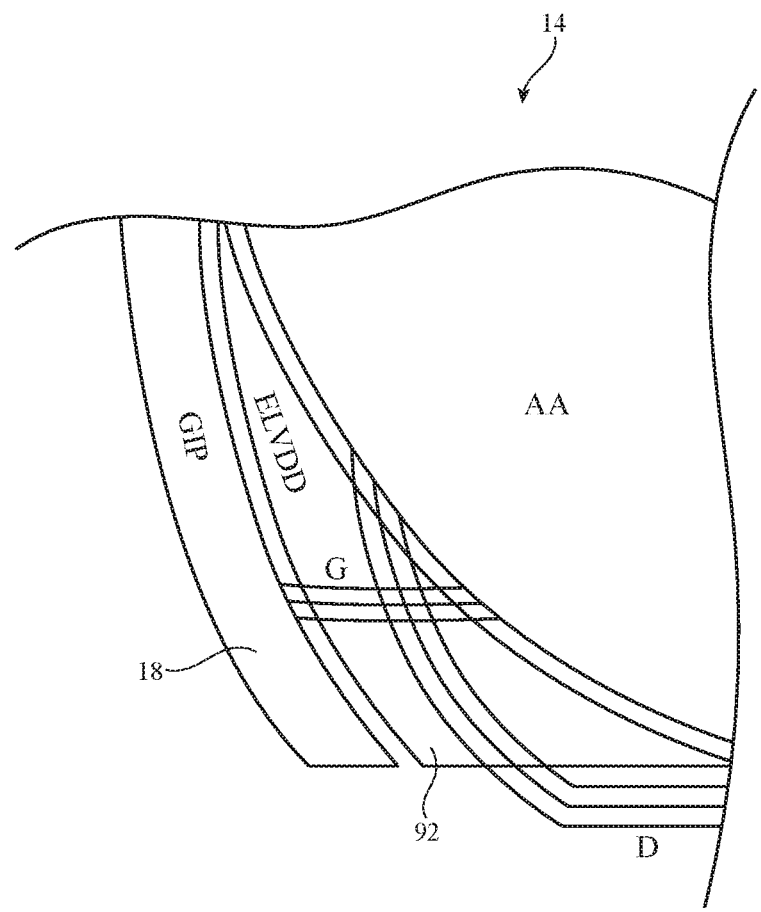
FIG. 12 is a top view of a rounded corner of an illustrative organic light-emitting diode display showing how a positive power supply voltage distribution path may be formed over data lines in accordance with an embodiment.

Forming displays with rounded corners and minimized inactive areas requires fanning out data lines (e.g., from tail region 24T of the display) to reach all of the columns of pixels in the display. FIG. 12 shows a top view of an illustrative display with data lines D (e.g., that are coupled to tail region 24T). The positive power voltage distribution path 92 may be formed over the data lines D. Gate lines G (each of which are associated with a respective row of pixels 22) may be coupled between gate driver circuitry 18 and the active area AA.

Figure 13:
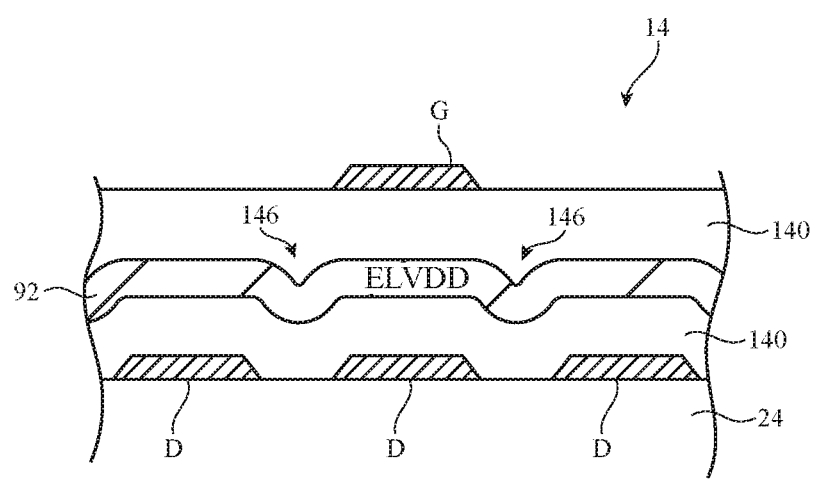
FIG. 13 is a cross-sectional side view of the illustrative display of FIG. 12 showing recesses in the positive power supply voltage distribution path in accordance with an embodiment.

FIG. 13 shows a cross-sectional side view of the display of FIG. 12. As shown in FIG. 13, data lines D may be formed on substrate 24. Additional layers may be formed over the data lines. A metal layer used to form ELVDD distribution path 92 is formed over the data lines. Gate lines G are then formed over the ELVDD distribution path. Dielectric layers 140 may be interposed between each metal layer. In the example of FIG. 13, one dielectric layer is interposed between data lines D and ELVDD distribution path 92 and one dielectric layer is interposed between ELVDD distribution path 92 and gate line G. This example is merely illustrative and more than one dielectric layer may be interposed between the conductive layers if desired. One or more dielectric layers may also be formed over gate line G. Dielectric layers 140 may be formed from any desired material. Dielectric layers 140 may be formed from the same material as planarization layers such as PLN2 and/or PLN1 in FIG. 4, from the same material as a pixel definition layer such as pixel definition layer 52 in FIG. 4, or any other desired material.

Due to the limited inactive area space in the rounded corner regions of the display, data lines D may be positioned close together. The close spacing between the data lines may cause undesired reflections from the rounded corner regions of the display. For example, because the data lines are positioned close together, the overlaying layers may have recesses (e.g., topology imparted by the data lines). Recesses 146 are shown in FIG. 13. If the data lines were further apart, recesses 146 would have shallower sidewalls (e.g., the upper surface of ELVDD distribution path 92 would be closer to planar). When the data lines are spaced close together as in FIG. 13, however, recesses 146 may have more sharply angled sidewalls. Because the ELVDD distribution path 92 is reflective, the sharply formed recesses 146 may cause the rounded corner region of the display to look different than other portions of the display. FIGS. 14-19 show illustrative arrangements that may be used to mitigate reflections from recesses 146 to ensure the display has a uniform appearance across the display.

Figure 14:
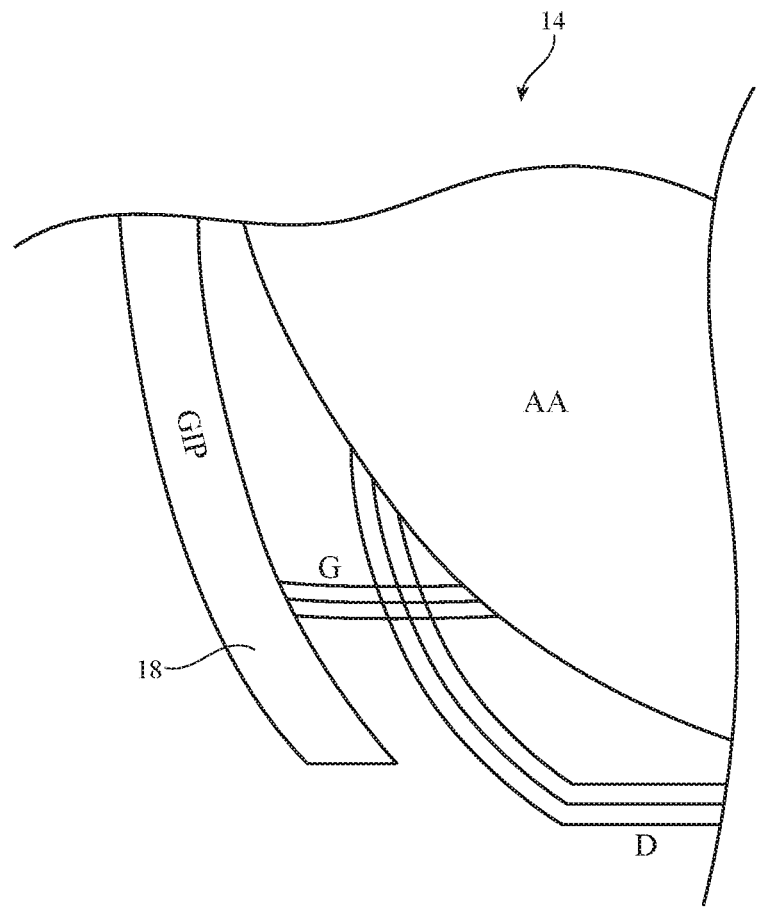
FIG. 14 is a top view of a rounded corner of an illustrative organic light-emitting diode display showing how the positive power supply voltage distribution path may be omitted for reflection mitigation in accordance with an embodiment.

FIG. 14 is a top view of an illustrative display that has the ELVDD distribution path removed in the rounded corner region to mitigate visible reflections from the ELVDD distribution path. As shown in FIG. 14, the illustrative display has data lines D that are coupled to tail region 24T and gate lines G coupled between gate driver circuitry 18 and the active area AA. As discussed in connection with FIGS. 12 and 13, the visible reflections caused by tight data line spacing are reflections off of the ELVDD distribution path. Therefore, in FIG. 14, removing the ELVDD distribution path in the rounded corner region mitigates the reflections caused by the data lines.

Pixel columns in the rounded corner region of the display may still receive the positive power supply voltage (even though the positive power supply voltage distribution path is removed below the pixel columns in the rounded corner region). To provide the positive power supply voltage to the pixel columns in the rounded corner region, vertical, horizontal, and/or L-shaped distribution paths may be used that pass through the active area of the display (as discussed in connection with FIG. 9, for example). In one embodiment, horizontal and vertical distribution paths may form an ELVDD distribution mesh that distributes the positive power supply voltage across the entire active area of the display. The pixel columns in the rounded corner region will receive the positive power supply voltage from the ELVDD distribution mesh (even if ELVDD distribution path 92 is removed in the rounded corner region). Alternatively, L-shaped distribution paths may be used to provide the positive power supply voltage to pixel columns in the rounded corner region.

Figure 15:
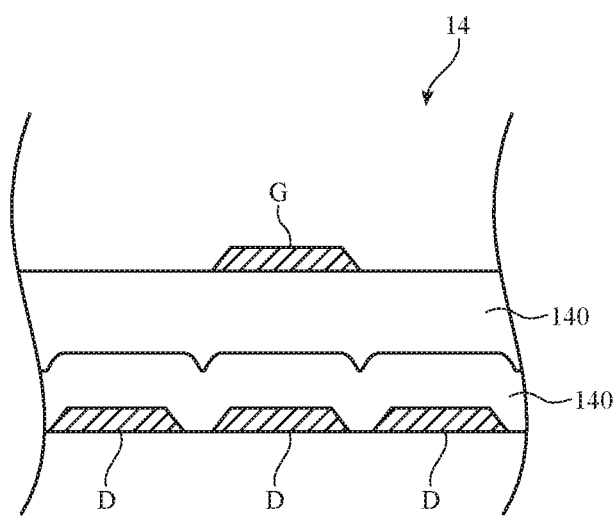
FIG. 15 is a cross-sectional side view of the illustrative display of FIG. 14 without the positive power supply voltage distribution path in accordance with an embodiment.

FIG. 15 shows a cross-sectional side view of the display of FIG. 14. As shown in FIG. 15, data lines D may be formed on substrate 24. Additional layers may be formed over the data lines. Gate lines G are formed over the data lines without an intervening ELVDD distribution path. Because the reflective ELVDD distribution path is not present in the display of FIG. 15, the undesirable reflections caused by data lines D are mitigated. One or more dielectric layers 140 may be interposed between each metal layer. One or more dielectric layers may also be formed over gate line G.

Figure 16:
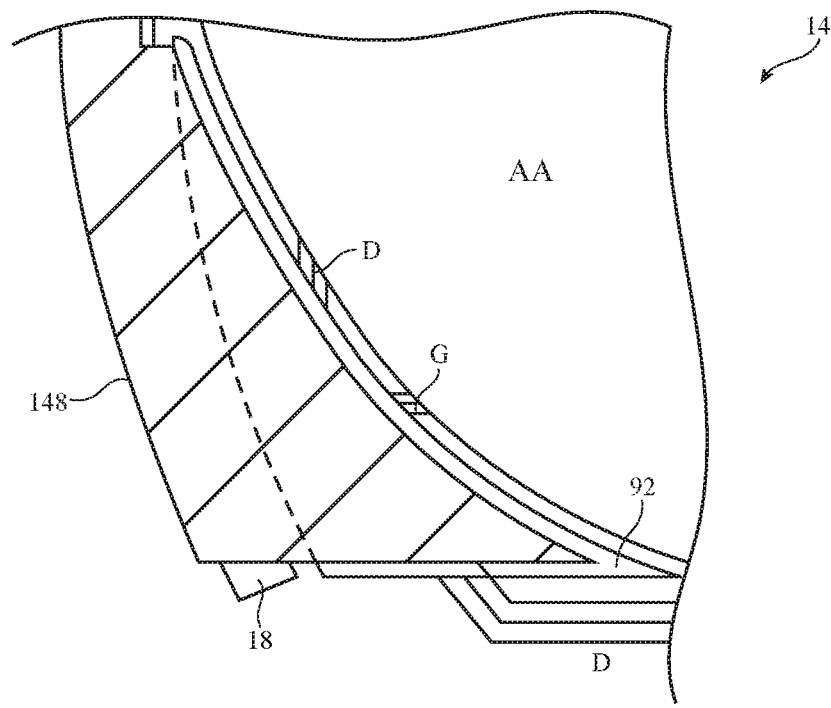
FIG. 16 is a top view of a rounded corner of an illustrative organic light-emitting diode display showing how a shielding layer may be formed over the positive power supply voltage distribution path for reflection mitigation in accordance with an embodiment.

FIG. 16 is a top view of an illustrative display that has an additional metal layer formed over the ELVDD distribution path to mitigate visible reflections from the ELVDD distribution path. As shown in FIG. 16, the illustrative display has data lines D that are coupled to tail region 24T and gate lines G coupled between gate driver circuitry 18 and the active area AA. ELVDD distribution path 92 is formed over the data lines. As discussed in connection with FIGS. 12 and 13, the visible reflections caused by tight data line spacing are reflections off of ELVDD distribution path 92. Therefore, in FIG. 16, an additional metal layer 148 is formed over the ELVDD distribution path in the rounded corner region to mitigate the reflections caused by the data lines. Additional metal layer 148 may not completely overlap the ELVDD distribution path. For example, a portion of the ELVDD distribution path closest to the edge of the active area may be left uncovered by layer 148.

Additional metal layer 148 may be an anode metal layer. Although the anode metal layer does not actually form an anode for a pixel, the layer of anode metal may be formed form the same layer of metal as the pixel anodes (and is thus referred to herein as anode metal or a layer of anode metal). Metal layer 148 may be formed in the same deposition step as the pixel anodes AN (and is therefore formed from the same material as the pixel anodes). Metal layer 148 in FIG. 16 may be the same as anode metal 114 shown in FIGS. 6, 7, and 10, for example. Anode metal 148 in FIG. 16 may cover gate driver circuitry 18 as well as data lines D. The anode metal 148 may contact a cathode layer formed over the active area of the display and an ELVSS distribution path (as shown in connection with FIGS. 6, 7, and 10). Although ELVDD distribution path 92 is shown in FIG. 16, the ELVDD distribution path may be omitted (as in FIG. 14) in embodiments where anode metal 148 is formed over the data lines in the rounded corner region.

Figure 17:
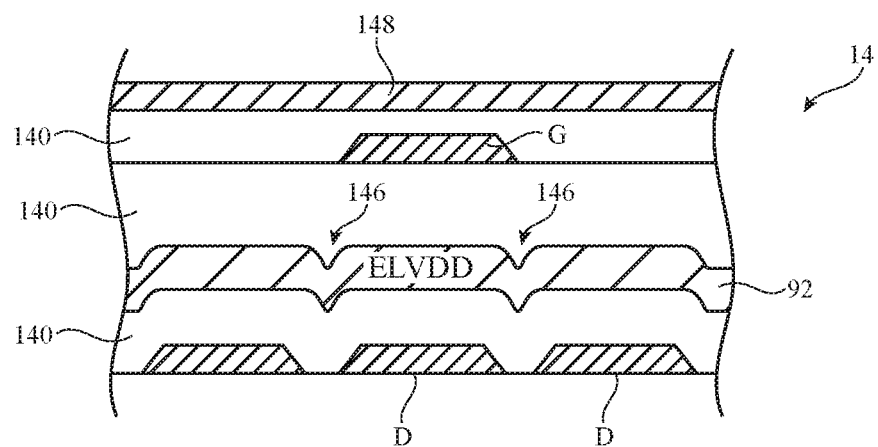
FIG. 17 is a cross-sectional side view of the illustrative display of FIG. 16 with the shielding layer in accordance with an embodiment.

FIG. 17 shows a cross-sectional side view of the display of FIG. 16. As shown in FIG. 16, data lines D may be formed on substrate 24. Additional layers may be formed over the data lines. A metal layer used to form ELVDD distribution path 92 is formed over the data lines. Gate lines G are then formed over the ELVDD distribution path. Anode metal 148 is formed over gate lines G. Dielectric layers 140 may be interposed between each metal layer. In the example of FIG. 17, one dielectric layer is interposed between data lines D and ELVDD distribution path 92, one dielectric layer is interposed between ELVDD distribution path 92 and gate line G, and one dielectric layer is interposed between gate line G and anode metal 148. This example is merely illustrative and more than one dielectric layer may be interposed between the conductive layers if desired. Forming anode metal 148 over ELVDD distribution path 92 as shown in FIG. 17 may prevent reflections from recesses 146 from being visible to the viewer. One or more dielectric layers may also be formed over anode metal 148.

Figure 18:
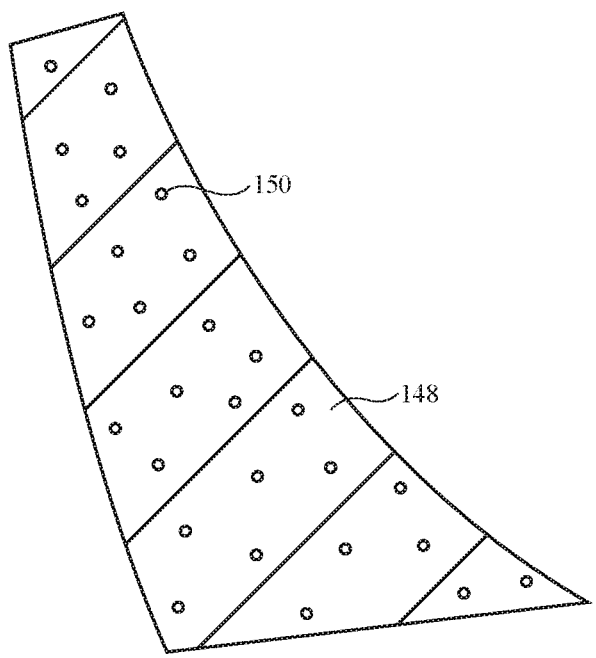
FIG. 18 is a top view of an illustrative shielding layer such as the shielding layer in FIG. 16 having holes in accordance with an embodiment.

Dielectric layers 140 in FIG. 17 may be formed from any desired material. In some embodiments, one or more of the dielectric layers may be formed from a material (e.g., an organic material) that can trap moisture (e.g., during manufacturing). If anode metal 148 is formed continuously over dielectric layers 140, the trapped moisture may leak into active area AA and possibly damage the display pixels. To ensure any moisture trapped in dielectric layers 140 can evaporate, anode metal 148 may be provided with holes 150 as shown in FIG. 18. Any desired number of holes may be provided in anode metal 148. Each hole may have any desired shape and size.

The example in FIGS. 16-18 of forming additional metal layer 148 from anode metal is merely illustrative. Metal layer 148 (sometimes referred to as shielding layer 148) may be formed from any desired material (e.g., an opaque dielectric material, non-anode-metal material, etc.).

Figure 19:
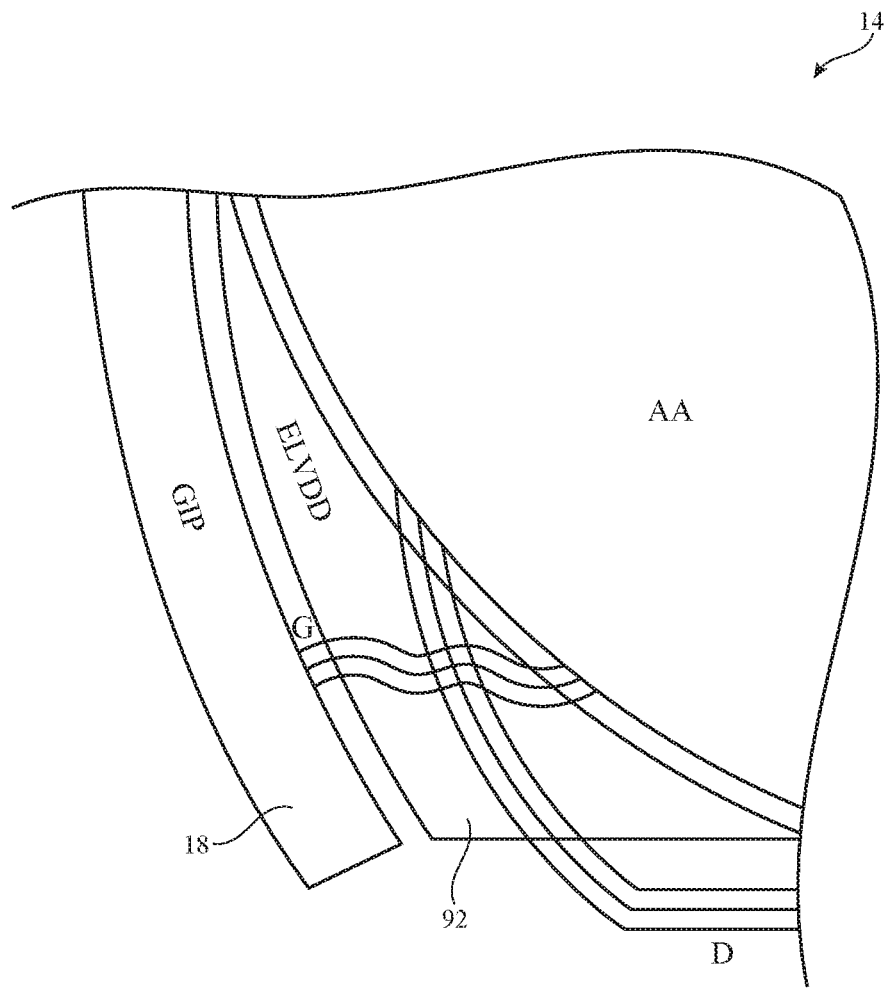
FIG. 19 is a top view of a rounded corner of an illustrative organic light-emitting diode display having non-linear gate lines formed over the positive power supply voltage distribution path in accordance with an embodiment.

Yet another arrangement for mitigating reflections caused by data lines D is shown in FIG. 19. As shown previously (e.g., FIG. 13), gate lines G are formed over the ELVDD distribution path 92. The gate lines may therefore be used to help mitigate reflections from the ELVDD distribution path. The width of the gate lines may be increased to increase the amount of area shielded by the gate lines. However, even with an increased gate line width the reflections may still be visible.

Changing the shape of the gate lines from a straight-line shape (as in FIG. 12, for example) to a non-straight-line shape as in FIG. 19 may mitigate periodic light reflections off of the underlying ELVDD distribution path. The gate lines of FIG. 12 may be referred to as linear gate lines because the portions of the gate lines that overlap ELVDD distribution path 92 are linear. The gate lines of FIG. 19 may be referred to as non-linear gate lines because the portions of the gate lines that overlap ELVDD distribution path 92 are non-linear.

The gate lines in FIG. 19 may have any desired non-linear shape. For example, each gate line may have a plurality of curved portions. Each curved portion may have the same bend radius as one or more of the other curved portions or may have a unique bend radius. Each curved portion may have any desired length. In another example, each gate line may have a plurality of linear segments that are arranged at angles with respect to one another. Each linear segment may have any desired length and any desired angle with respect to adjacent linear segments. In yet another example, each gate line may have a combination of curved portions and linear portions. The non-straight-line shaped gate lines of FIG. 19 may be described as serpentine, non-linear, following a meandering path, having a sine wave shape, wavy, having a zigzag shape, etc.

Figure 20:
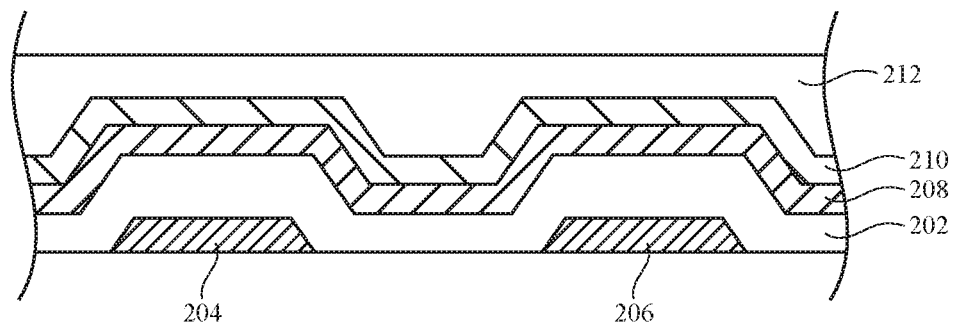
FIG. 20 is a cross-sectional side view of an illustrative display that includes an anti-reflective layer between a metal layer and a dielectric layer in a rounded corner portion in accordance with an embodiment.

FIGS. 20-25 show additional embodiments for mitigating reflections in a rounded corner region of the display. As shown in FIG. 20, a dielectric layer 202 may be formed over metal layers 204 and 206 (on a substrate layer, for example). Dielectric layer 202 may be formed from the same material as planarization layers such as PLN2 and/or PLN1 in FIG. 4, from the same material as a pixel definition layer such as pixel definition layer 52 in FIG. 4, or any other desired material. Metal layers 204 and 206 may be gate lines, data lines, or any other desired type of signal line.

A metal layer 208 may be formed over dielectric layer 202. Metal layer 208 may be an ELVDD distribution path (e.g., ELVDD distribution path 92 in FIG. 13) or any other desired metal layer in the display. Because of the presence of metal layers 204 and 206, metal layer 208 has recesses similar to as shown in connection with FIG. 13. In FIG. 20, to help mitigate reflections caused by metal layer 208, an anti-reflection film 210 is formed over metal layer 208. Anti-reflection film 210 may be deposited onto metal layer 208 or may be formed using a surface treatment of metal layer 208. The anti-reflection film may sometimes be referred to as an anti-reflection coating or anti-reflection layer. The anti-reflective layer may be formed one or more of niobium oxide, niobium nitride, titanium oxide, titanium nitride, silicon nitride, chromium oxide, etc. The anti-reflective layer may reflect less than 1% of incident light, less than 5% of incident light, less than 10% of incident light, less than 20% of incident light, less than 40% of incident light, etc.

Dielectric layer 212 may be formed over anti-reflection layer 210. Dielectric layer 212 may be formed from the same material as planarization layers such as PLN2 and/or PLN1 in FIG. 4, from the same material as a pixel definition layer such as pixel definition layer 52 in FIG. 4, or any other desired material.

Figure 21:
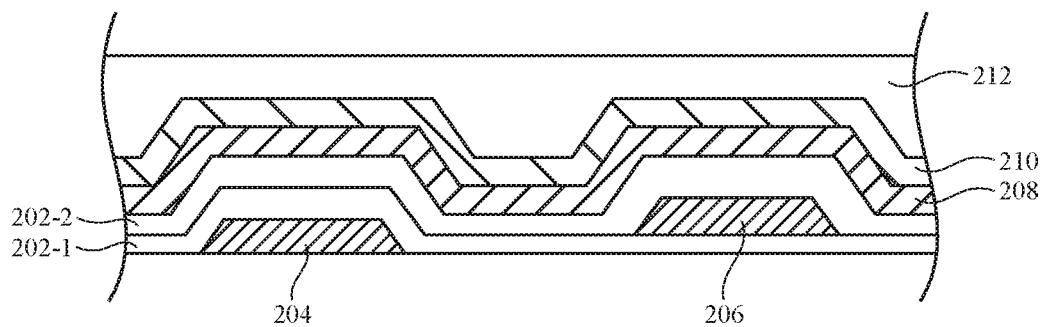
FIG. 21 is a cross-sectional side view of an illustrative display that includes an anti-reflective layer between a metal layer and a dielectric layer in a rounded corner portion and that has multiple dielectric layers between metal layers in accordance with an embodiment.

The example in FIG. 20 of a single dielectric layer 202 being formed between metal layers 204/206 and metal layer 208 is merely illustrative. FIG. 21 is a cross-sectional side view of an illustrative display with a first dielectric layer 202-1 formed over metal layer 204 but under metal layer 206. In other words, metal layer 204 is interposed between a first portion of dielectric layer 202-1 and the substrate. A second portion of dielectric layer 202-1 is interposed between metal layer 206 and the substrate. An additional dielectric layer 202-2 is formed over metal layer 206. The first portion of dielectric layer 202-1 is interposed between metal layer 204 and a first portion of dielectric layer 202-2. Metal layer 206 is interposed between the second portion of dielectric layer 202-1 and a second portion of dielectric layer 202-2. Both dielectric layers 202-1 and 202-2 may be formed from the same material as planarization layers such as PLN2 and/or PLN1 in FIG. 4, from the same material as a pixel definition layer such as pixel definition layer 52 in FIG. 4, or any other desired material. Dielectric layers 202-1 and 202-2 may be formed from different materials. Metal layer 208, anti-reflection layer 210, and dielectric layer 212 are formed over dielectric layer 202-2 similar to as shown and discussed in FIG. 20.

Figure 22:
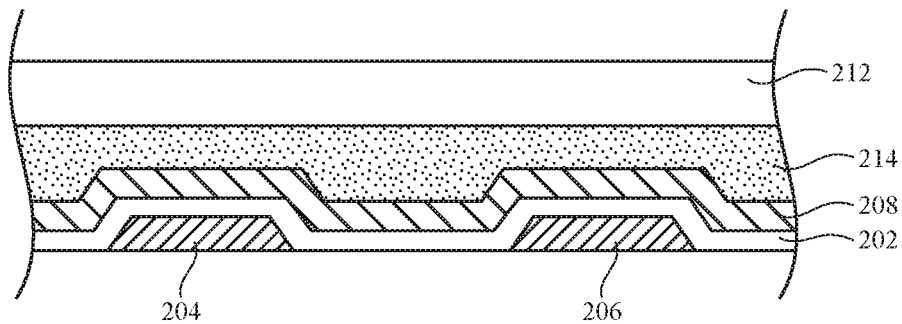
FIG. 22 is a cross-sectional side view of an illustrative display that includes a light-absorbing organic layer between a metal layer and a dielectric layer in a rounded corner portion in accordance with an embodiment.

The example of an anti-reflection coating shown in FIGS. 20 and 21 is merely illustrative. In another possible arrangement, a light-absorbing organic material may be incorporated into the display to mitigate reflections from a metal layer. FIG. 22 is a cross-sectional side view of an illustrative display that includes a light-absorbing organic layer 214. Layer 214 may sometimes be referred to as light-absorbing layer 214, black matrix layer 214, organic layer 214, etc. Layer 214 may be formed from any desired organic material. The light-absorbing layer may absorb more than 95% of incident light, more than 90% of incident light, more than 80% of incident light, more than 70% of incident light, more than 60% of incident light, etc. The light absorbing layer may reflect less than 1% of incident light, less than 5% of incident light, less than 10% of incident light, less than 20% of incident light, less than 40% of incident light, etc.

Figure 23:
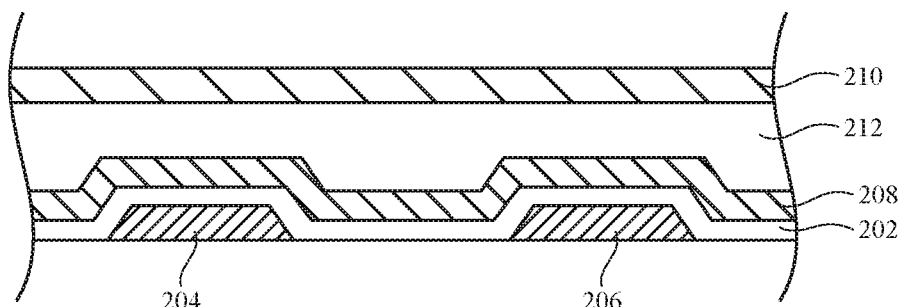
FIG. 23 is a cross-sectional side view of an illustrative display that includes an anti-reflective layer above a metal layer and a dielectric layer in a rounded corner portion in accordance with an embodiment.
Figure 24:
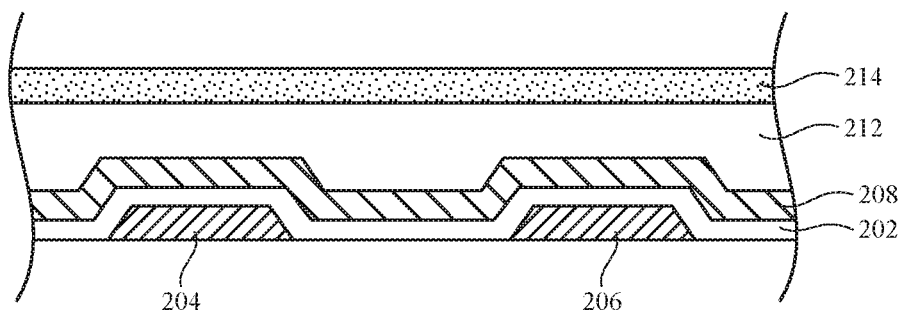
FIG. 24 is a cross-sectional side view of an illustrative display that includes a light-absorbing organic layer above a metal layer and a dielectric layer in a rounded corner portion in accordance with an embodiment.

As shown in FIG. 22, black matrix layer 214 may be interposed between metal layer 208 and dielectric layer 212. FIG. 23 is a cross-sectional side view of a display showing how anti-reflective layer 210 may be formed over dielectric layer 212. In this case, dielectric layer 212 is interposed between metal layer 208 and anti-reflective layer 210. Similarly, FIG. 24 is a cross-sectional side view of a display showing how black matrix layer 214 may be formed over dielectric layer 212. In this case, dielectric layer 212 is interposed between metal layer 208 and black matrix layer 214.

Figure 25:
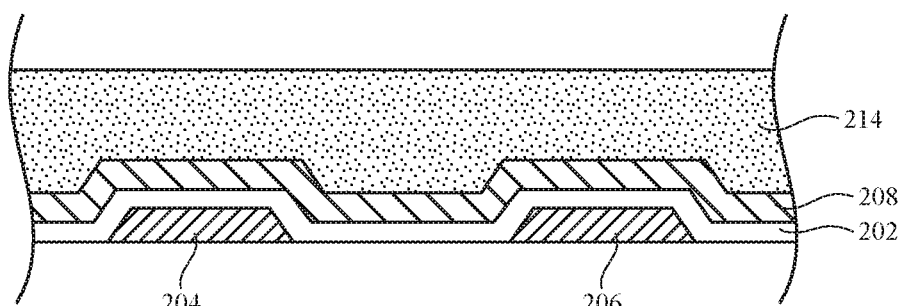
FIG. 25 is a cross-sectional side view of an illustrative display that includes a light-absorbing organic layer above a metal layer in a rounded corner portion in accordance with an embodiment.

In one possible embodiment, shown in FIG. 25, dielectric layer 212 may be replaced by black matrix layer 214. In other words, the black matrix layer is formed in direct contact with metal layer 208 without the presence of an additional dielectric layer.

It should be noted that in any of the embodiments of FIGS. 22-25, dielectric layer 202 may be split between two dielectric layers as shown in FIG. 21. Additionally, in any of the embodiments of FIGS. 20-25, additional signal lines (metal layers) may optionally be formed on the upper layer (e.g., on dielectric layer 212 in FIGS. 20-22, on anti-reflective layer 210 in FIG. 23, or on black matrix layer 214 in FIGS. 24 and 25).

The aforementioned embodiments may be combined in any desired manner. For example, in the embodiment of FIG. 14 or FIG. 16, non-linear gate lines as shown in FIG. 19 may be used. In another example, the ELVDD distribution path may be removed in an area over the data lines as in FIG. 14 and this area (that is not covered by the ELVDD distribution path) may be covered by an additional metal shield as in FIG. 16. Similarly, any combination of the embodiments shown in FIGS. 14-19 may be used in the display of FIG. 9 (with an expanded ELVSS distribution path). Anti-reflective layers or light-absorbing layers of the type shown in FIGS. 20-25 may be incorporated with any of the embodiments shown in FIGS. 14-19.

The foregoing is merely illustrative and various modifications can be made to the described embodiments. The foregoing embodiments may be implemented individually or in any combination.

What is claimed is:

1. An organic light-emitting diode display comprising:
    thin-film transistor circuitry;
    a substrate having an active area with an array of pixels formed from the thin-film transistor circuitry;
    a metal positive power supply path on the substrate that carries a positive power supply voltage to the active area, wherein the metal positive power supply path has a first portion, a second portion, and a cutout between the first portion and the second portion; and
    a metal negative power supply path on the substrate that carries a negative power supply voltage to the active area, wherein the metal negative power supply path has:
        a horizontal portion having a first width and a first length that is greater than the first width and that extends in a first direction;
        a vertical portion having a second width and a second length that is greater than the second width and that extends in a second direction that is orthogonal to the first direction; and
        a rounded corner portion interposed between the vertical portion and the horizontal portion, wherein the horizontal portion is formed in the cutout of the metal positive power supply path.

2. The organic light-emitting diode display defined in claim 1, wherein at least some of the horizontal portion of the metal negative power supply path is directly adjacent to the active area.

3. The organic light-emitting diode display defined in claim 1, further comprising:
    gate driver circuitry, wherein the second portion of the metal positive power supply path and the gate driver circuitry are interposed between the active area and the rounded corner portion of the metal negative power supply path.

4. The organic light-emitting diode display defined in claim 1, further comprising:
    gate driver circuitry, wherein the gate driver circuitry is interposed between the active area and the vertical portion of the metal negative power supply path, wherein the second portion of the metal positive power supply path and the gate driver circuitry are interposed between the active area and the rounded corner portion of the metal negative power supply path, and wherein the metal positive power supply path is not interposed between the active area and at least some of the horizontal portion of the metal negative power supply path.

5. The organic light-emitting diode display defined in claim 1, wherein the first portion of the metal positive power supply path is a horizontal portion and wherein the second portion of the metal positive power supply path is a rounded corner portion.

6. The organic light-emitting diode display defined in claim 5, further comprising:
a plurality of conductive paths within the active area that electrically connect the horizontal portion of the metal positive power supply path to the rounded corner portion of the metal positive power supply path.

7. The organic light-emitting diode display defined in claim 5, further comprising:
a pixel definition layer on the thin-film transistor circuitry, wherein the pixel definition layer has openings each of which contains an anode and an organic emissive layer for an organic light-emitting diode and each of which is associated with a respective one of the pixels;
a cathode layer that covers the array of pixels; and
a metal layer with a plurality of portions that form the anodes for the organic light-emitting diodes and an additional portion that electrically connects the cathode layer to the metal negative power supply path.

8. The organic light-emitting diode display defined in claim 7, wherein the additional portion of the metal layer covers and is electrically connected to the vertical portion of the metal negative power supply path, the rounded corner portion of the metal negative power supply path, and the horizontal portion of the metal negative power supply path.

9. The organic light-emitting diode display defined in claim 8, further comprising:
a plurality of data lines that are covered by the rounded corner portion of the metal positive power supply path; and
a plurality of gate lines formed over the rounded corner portion of metal positive power supply path, wherein at least one gate line of the plurality of gate lines has a plurality of curved portions.

10. The organic light-emitting diode display defined in claim 9, wherein the additional portion of the metal layer extends over the plurality of gate lines and the rounded corner portion of the metal positive power supply path.

11. The organic light-emitting diode display defined in claim 8, further comprising:
a plurality of data lines that are covered by the rounded corner portion of the metal positive power supply path; and
an anti-reflection layer that is formed over the rounded corner portion of the metal positive power supply path.

12. The organic light-emitting diode display defined in claim 8, further comprising:
a plurality of data lines that are covered by the rounded corner portion of the metal positive power supply path; and
a light-absorbing organic layer that is formed over the rounded corner portion of the metal positive power supply path.

13. The organic light-emitting diode display defined in claim 1, further comprising:
gate driver circuitry, wherein the metal positive power supply path is not interposed between the active area and at least some of the horizontal portion of the metal negative power supply path.

14. The organic light-emitting diode display defined in claim 1, wherein the active area has a rounded corner and wherein the second portion of the metal positive power supply path is a rounded corner portion having a curved edge that is adjacent to the rounded corner of the active area.

15. An organic light-emitting diode display having an array of pixels, comprising:
a substrate;
thin-film transistor circuitry on the substrate;
a pixel definition layer on the thin-film transistor circuitry, wherein the pixel definition layer has openings each of which contains an anode and an organic emissive layer for an organic light-emitting diode and each of which is associated with a respective one of the pixels;
a cathode layer that covers the array of pixels;
a plurality of data lines;
a metal negative power supply path on the substrate, wherein the anodes for the organic light-emitting diodes are formed from a metal layer, wherein an additional portion of the metal layer electrically connects the cathode layer to the metal negative power supply path, and wherein the additional portion of the metal layer covers the plurality of the data lines; and
a metal positive power supply path on the substrate, wherein the metal positive power supply path has a cutout region that is interposed between the plurality of data lines and the additional portion of the metal layer.

16. An organic light-emitting diode display having an array of pixels, comprising:
a substrate;
thin-film transistor circuitry on the substrate;
a pixel definition layer on the thin-film transistor circuitry, wherein the pixel definition layer has openings each of which contains an anode and an organic emissive layer for an organic light-emitting diode and each of which is associated with a respective one of the pixels;
a cathode layer that covers the array of pixels;
a plurality of data lines;
a metal negative power supply path on the substrate, wherein the anodes for the organic light-emitting diodes are formed from a metal layer, wherein an additional portion of the metal layer electrically connects the cathode layer to the metal negative power supply path, and wherein the additional portion of the metal layer covers the plurality of the data lines; and
a metal positive power supply path on the substrate, wherein a portion of the metal positive power supply path is interposed between the additional portion of the metal layer and the plurality of data lines.

17. The organic light-emitting diode display defined in claim 16,
wherein the substrate has an active area with the array of pixels and wherein the portion of the metal positive power supply path extends adjacent to a rounded corner of the active area.

18. The organic light-emitting diode display defined in claim 16, further comprising:
a plurality of gate lines interposed between the metal positive power supply path and the additional portion of the metal layer.

19. The organic light-emitting diode display defined in claim 16, wherein at least one gate line of the plurality of gate lines is non-linear underneath the additional portion of the metal layer.

20. The organic light-emitting diode display defined in claim 19, wherein the at least one gate line of the plurality of gate lines has a plurality of curved portions underneath the additional portion of the metal layer.

21. The organic light-emitting diode display defined in claim 16, wherein the additional portion of the metal layer has a plurality of holes.

* * * * *